US010133095B2

(12) United States Patent
Nishida

(10) Patent No.: US 10,133,095 B2
(45) Date of Patent: Nov. 20, 2018

(54) QUANTUM INTERFERENCE DEVICE, ATOMIC OSCILLATOR, ELECTRONIC APPARATUS, AND MOVING OBJECT COMPRISING FM-MODULATED ADJUSTMENT LIGHT

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 112 days.

(21) Appl. No.: 15/419,179

(22) Filed: Jan. 30, 2017

(65) Prior Publication Data

US 2017/0219852 A1 Aug. 3, 2017

(30) Foreign Application Priority Data

Feb. 2, 2016 (JP) ................. 2016-017717

(51) Int. Cl.
| | | |
|---|---|---|
| *H03L 7/26* | (2006.01) | |
| *G02F 1/01* | (2006.01) | |
| *G01D 5/26* | (2006.01) | |
| *G02B 27/28* | (2006.01) | |
| *H01S 5/00* | (2006.01) | |
| *H01S 5/183* | (2006.01) | |

(52) U.S. Cl.
CPC .......... *G02F 1/0126* (2013.01); *G01D 5/266* (2013.01); *G02B 27/286* (2013.01); *H01S 5/0078* (2013.01); *H01S 5/0085* (2013.01); *H01S 5/18355* (2013.01); *H03L 7/26* (2013.01)

(58) Field of Classification Search
CPC .... G01D 5/266; G02B 27/286; G02F 1/0126; H01S 5/0085; H01S 5/18355; H03L 7/26
USPC .................................. 250/221, 205
See application file for complete search history.

(56) References Cited

U.S. PATENT DOCUMENTS 6,320,472 B1 * 11/2001 Vanier .................... G04F 5/145
331/94.1
2016/0105150 A1 4/2016 Hayashi et al.

FOREIGN PATENT DOCUMENTS

| JP | 2013-125907 A | 6/2013 |
|---|---|---|
| JP | 2014-171195 A | 9/2014 |
| JP | 2015-057841 A | 3/2015 |
| JP | 2016-081997 A | 5/2016 |
| JP | 2016-081998 A | 5/2016 |

* cited by examiner

*Primary Examiner* — Que T Le
(74) *Attorney, Agent, or Firm* — Harness, Dickey & Pierce, P.L.C.

(57) ABSTRACT

A quantum interference device (atomic oscillator) includes: an atom cell that encapsulates an alkali metal; a first light source portion that emits light including a resonance light pair, the resonance light pair being circularly polarized in the same direction and causing the alkali metal to resonate; a second light source portion that emits light including adjustment light, the adjustment light being circularly polarized in a direction opposite to the resonance light pair and causing the alkali metal to resonate; and a light receiving portion that receives the resonance light pair having passed through the atom cell, in which the adjustment light is FM-modulated.

20 Claims, 16 Drawing Sheets ered with the resonance light pair as the adjustment light.
QUANTUM INTERFERENCE DEVICE, ATOMIC OSCILLATOR, ELECTRONIC APPARATUS, AND MOVING OBJECT COMPRISING FM-MODULATED ADJUSTMENT LIGHT

BACKGROUND

1. Technical Field

The present invention relates to a quantum interference device, an atomic oscillator, an electronic apparatus, and a moving object.

2. Related Art

As an oscillator having high-accuracy oscillation characteristics on along-term basis, an atomic oscillator that oscillates based on energy transition of alkali metal atoms such as rubidium or cesium is known.

In general, the operation principle of an atomic oscillator is classified into two types including: a type in which a double resonance phenomenon caused by light and microwaves is used; and a type in which a quantum interference effect (CPT: Coherent Population Trapping) caused by two kinds of light having different wavelengths is used. As compared to an atomic oscillator in which the double resonance phenomenon is used, an atomic oscillator in which the quantum interference effect is used can be further reduced in size and thus has been expected to be mounted in various apparatuses in recent years (for example, refer to JP-A-2013-125907).

For example as disclosed in JP-A-2013-125907, an atomic oscillator in which the quantum interference effect is used includes: a gas cell that encapsulates a gaseous alkali metal; a light source that emits resonance light for causing the alkali metal in the gas cell to resonate; and a light detector (light receiving portion) that detects resonance light having passed through the gas cell. In such an atomic oscillator, when a difference in frequency between two kinds of resonance light is a specific value, an electromagnetically induced transparency (EIT) phenomenon occurs in which both the two kinds of resonance light pass through the alkali metal in the gas cell without being absorbed. At this time, an EIT signal, which is a sharp signal generated during the EIT phenomenon, is detected by the light detector, and this detected EIT signal is used as a reference signal.

However, in the atomic oscillator disclosed in JP-A-2013-125907, constantly polarized resonance light is continuously irradiated, and thus the number of electrons in the alkali metal contributing to resonance decreases over time. Therefore, the electromagnetically induced transparency phenomenon is less likely to occur, and the intensity of the EIT signal is attenuated. Therefore, there is a problem in that the atomic oscillator cannot oscillate at a high-accuracy reference frequency.

SUMMARY

An advantage of some aspects of the invention is to solve at least a part of the problems described above, and the invention can be implemented as the following application examples.

Application Example 1

A quantum interference device according to this application example includes: an atom cell that encapsulates a metal; a first light source portion that emits first light including a resonance light pair, the resonance light pair being circularly polarized in the same direction and causing the metal to resonate; a second light source portion that emits second light including adjustment light, the adjustment light being circularly polarized in a direction opposite to the resonance light pair and causing the metal to resonate; and a light receiving portion that receives the resonance light pair having passed through the atom cell, in which the adjustment light is FM-modulated.

According to this application example, the metal is irradiated not only with the resonance light pair which is circularly polarized in the same direction but also with the resonance light which is circularly polarized in a direction opposite to the resonance light pair as the adjustment light. As a result, bias of a distribution of magnetic quantum numbers caused by the resonance light pair may be cancelled out or alleviated by the adjustment light, and thus bias of a distribution of magnetic quantum numbers of the metal may be reduced. In addition, by FM-modulating the adjustment light, the wavelength of the adjustment light for causing the metal to resonate may be adjusted to be in an absorption wavelength width, and the intensity of the adjustment light may be adjusted to be in an allowable intensity range. Therefore, the number of metal atoms having desired magnetic quantum numbers contributing to EIT may be increased. As a result, an effect of improving the intensity of an EIT signal may be significantly exhibited. Thus, the intensity of an EIT signal may be effectively improved.

Application Example 2

In the quantum interference device according to the above-described application example, it is preferable that a frequency of the FM modulation is lower than a frequency which is a wavelength width of an absorption wavelength range of the metal.

According to this application example, the frequency at which the adjustment light is FM-modulated is lower than the frequency which is the wavelength width of an absorption wavelength range of the metal. As a result, at least one of plural wavelength spectra of the FM-modulated adjustment light may be easily adjusted in a wavelength width of an absorption wavelength range of the metal which is desired to cause the metal to resonate and in an allowable intensity range. Therefore, the number of metal atoms having desired magnetic quantum numbers contributing to EIT may be increased, and thus the intensity of an EIT signal may be effectively improved.

Application Example 3

In the quantum interference device according to the application example, it is preferable that a wavelength of the adjustment light is separated from a wavelength of the resonance light pair.

According to this application example, the wavelength of the adjustment light is separated from the wavelength of the resonance light pair. Therefore, the generation of an unnecessary signal caused by the adjustment light which has an effect on the resonance light pair may be reduced.

Application Example 4

In the quantum interference device according to the application example, it is preferable that the first light source portion has a first surface emitting laser that oscillates at a wavelength of 895 nm and that the second light source portion has a second surface emitting laser that oscillates at a wavelength of 852 nm.

According to this application example, the wavelength of the resonance light pair that oscillates in the first surface emitting laser is separated from the wavelength of the adjustment light that oscillates in the second surface emitting laser. Therefore, the generation of an unnecessary signal caused by the adjustment light which has an effect on the resonance light pair may be reduced.

Application Example 5

In the quantum interference device according to the application example, it is preferable that the first light source portion has a first light source that emits linearly polarized light, that the second light source portion has a second light source that emits linearly polarized light, and that the quantum interference device further comprises a λ/4 wave plate that is provided between the first light source portion and the second light source portion and through which two kinds of light emitted from the first light source and the second light source pass.

According to this application example, the λ/4 wave plate is disposed between the first and second light sources and the atom cell. As a result, two kinds of light emitted from the first light source and the second light source may be allowed to pass through the λ/4 wave plate, and the device configuration may be simplified.

Application Example 6

It is preferable that the quantum interference device according to the application example further includes a wavelength filter that is disposed between the atom cell and the light receiving portion and through which the resonance light pair passes.

According to this application example, the wavelength filter through which only the resonance light pair passes is disposed between the atom cell and the light receiving portion. As a result, the adjustment light does not pass through the wavelength filter. Thus, the light receiving portion receives only the resonance light pair, and the reception of the adjustment light by the light receiving portion may be prevented or reduced.

Application Example 7

According to this application example, there is provided an atomic oscillator including the quantum interference device according to the application example.

According to this application example, an atomic oscillator may be provided which includes the quantum interference device in which the intensity of an EIT signal may be effectively improved.

Application Example 8

An electronic apparatus according to this application example includes the quantum interference device according to the application example.

According to this application example, an electronic apparatus may be provided which includes the quantum interference device in which the intensity of an EIT signal may be effectively improved.

Application Example 9

A moving object according to this application example includes the quantum interference device according to the application example.

According to this application example, a moving object may be provided which includes the quantum interference device in which the intensity of an EIT signal may be effectively improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a moving object according to the invention will be described in detail with reference to embodiments shown in the accompanying drawings.

1. Atomic Oscillator (Quantum Interference Device)

First, the atomic oscillator according to the invention (atomic oscillator including the quantum interference device according to the invention) will be described. Hereinafter, an example in which the quantum interference device according to the invention is applied to the atomic oscillator will be described. However, the quantum interference device according to the invention is not limited to this example and is applicable to, for example, a device such as a magnetic sensor or a quantum memory.

First Embodiment

First, an atomic oscillator according to a first embodiment of the invention will be simply described.

Figure 1:
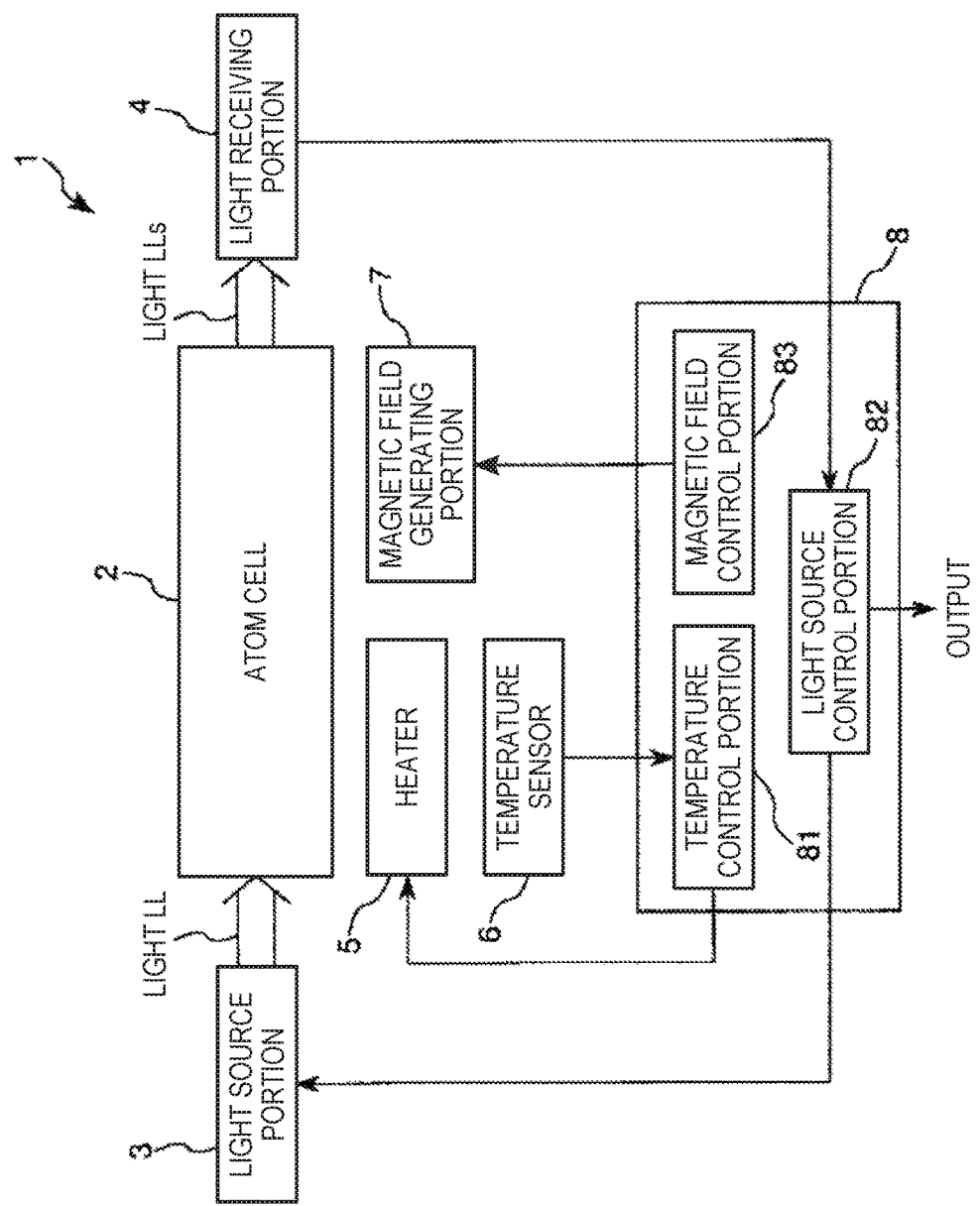
FIG. 1 is a schematic diagram showing an atomic oscillator (quantum interference device) according to a first embodiment of the invention.
Figure 2:
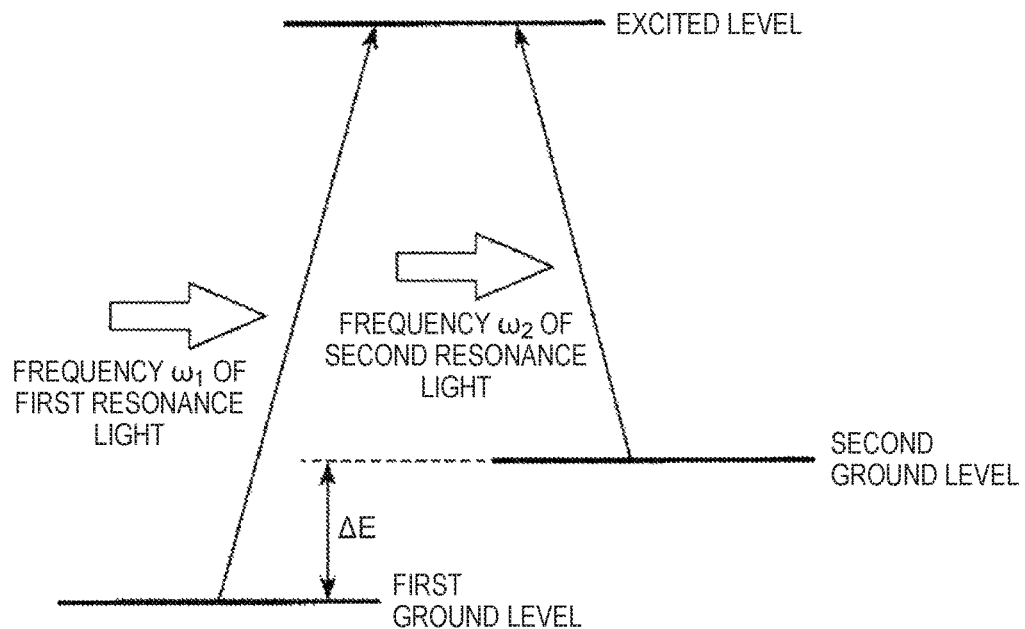
FIG. 2 is a diagram schematically showing energy states of alkali metal atoms.
Figure 3:
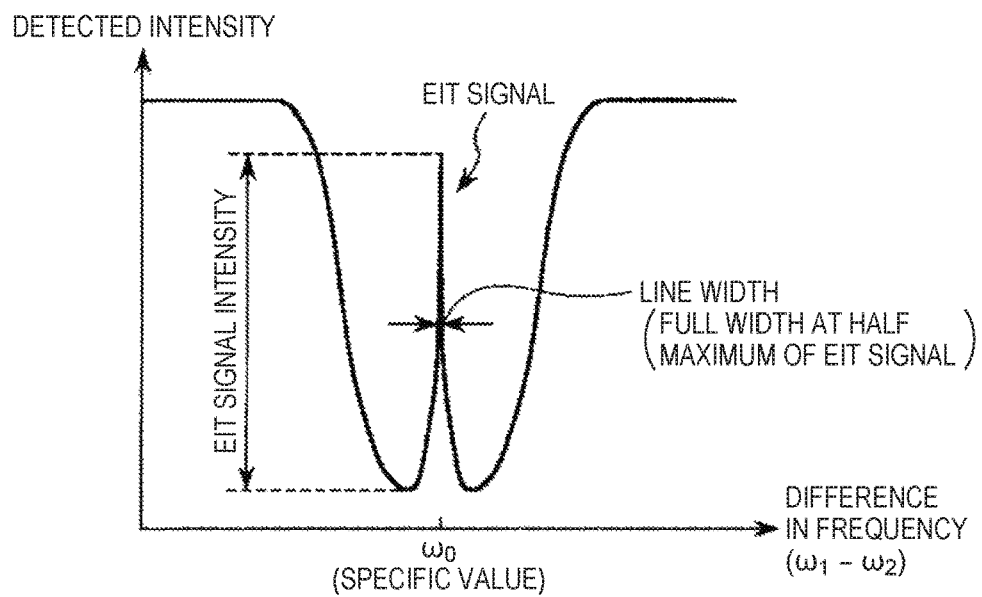
FIG. 3 is a graph showing a relationship between a difference in frequency between two kinds of light emitted from a light source portion and an intensity of light detected by a light receiving portion.

FIG. 1 is a schematic diagram showing the atomic oscillator (quantum interference device) according to the first embodiment of the invention. FIG. 2 is a diagram schematically showing energy states of alkali metal atoms. FIG. 3 is a graph showing a relationship between a difference in frequency between two kinds of light emitted from a light source portion and an intensity of light detected by a light receiving portion.

An atomic oscillator 1 shown in FIG. 1 uses a quantum interference effect. As shown in FIG. 1, the atomic oscillator 1 includes an atom cell 2 (gas cell), a light source portion 3, a light receiving portion 4, a heater 5, a temperature sensor 6, a magnetic field generating portion 7, and a control portion 8.

First, the principle of the atomic oscillator 1 will be simply described.

As shown in FIG. 1, in the atomic oscillator 1, the light source portion 3 emits light LL to the atom cell 2, and light LLs having passed through the atom cell 2 is detected by the light receiving portion 4.

The atom cell 2 encapsulates a gaseous alkali metal (metal atoms). As shown in FIG. 2, the alkali metal has three energy levels including two ground levels (a first ground level and a second ground level) and an excited level. Here, the first ground level is an energy state lower than the second ground level.

The light LL emitted from the light source portion 3 includes first resonance light and second resonance light as two kinds of resonance light having different frequencies. When the above-described gaseous alkali metal is irradiated with the first resonance light and the second resonance light, light absorptivities (light transmittances) of the alkali metal to the first resonance light and the second resonance light vary depending on a difference ($\omega_1 - \omega_2$) between a frequency $\omega_1$ of the first resonance light and a frequency $\omega_2$ of the second resonance light.

When the difference ($\omega_1 - \omega_2$) between the frequency $\omega_1$ of the first resonance light and the frequency $\omega_2$ of the second resonance light matches with a frequency corresponding to an energy difference $\Delta E$ between the first ground level and the second ground level, excitation from each of the first ground level and the second ground level to the excited level is stopped. At this time, both the first resonance light and the second resonance light pass through the alkali metal without being absorbed. This phenomenon is called a CPT phenomenon or an electromagnetically induced transparency (EIT) phenomenon.

For example, it is assumed that the light source portion 3 fixes the frequency $\omega_1$ of the first resonance light and changes the frequency $\omega_2$ of the second resonance light. In this case, when the difference ($\omega_1 - \omega_2$) between the frequency $\omega_1$ of the first resonance light and the frequency $\omega_2$ of the second resonance light matches with a frequency $\omega_0$ corresponding to the energy difference $\Delta E$ between the first ground level and the second ground level, The detected intensity of the light receiving portion 4 rapidly increases sharply as shown in FIG. 3. Such a sharp signal is detected as an EIT signal. This EIT signal has a peculiar value which is determined based on the kind of the alkali metal. Therefore, by using such an EIT signal as a reference, a high-accuracy oscillator can be configured.

Hereinafter, each portion of the atomic oscillator 1 will be simply described.

Atom Cell

The atom cell 2 encapsulate a gaseous alkali metal such as rubidium, cesium, or sodium. In addition, the atom cell 2 optionally further encapsulates a rare gas such as argon or neon, or an inert gas such as nitrogen as a buffer gas in addition to the alkali metal gas.

Although the details will be described below, the atom cell 2 includes: a body portion having through holes; and a pair of window portions that block openings of the through hole of the body portion. As a result, an internal space in which the gaseous alkali metal is encapsulated is formed.

Light Source Portion

The light source portion 3 has a function of emitting the light LL which includes the first resonance light and the second resonance light constituting a resonance light pair, the resonance light pair causing the alkali metal atoms to resonate in the atom cell 2.

In addition, the light LL emitted from the light source portion 3 includes third resonance light in addition to the first resonance light and the second resonance light.

The first resonance light is light (probe light) that excites the alkali metal atoms in the atom cell 2 from the above-described first ground level to the excited level. On the other hand, the second resonance light is light (coupling light) that excites the alkali metal atoms in the atom cell 2 from the above-described second ground level to the excited level. Here, the first resonance light and the second resonance light are circularly polarized in the same direction. In addition, the third resonance light is "adjustment light" (repump light) that adjusts magnetic quantum numbers of the alkali metal in the atom cell 2. This third resonance light is circularly polarized in a direction opposite to the first resonance light and the second resonance light. As a result, the magnetic quantum numbers of the alkali metal atoms in the atom cell 2 can be adjusted. The light source portion 3 will be described below in detail. "Circularly polarized light" is light in which a vibration direction of either an electric field component or a magnetic field component of an optical wave rotates in a plane perpendicular to a traveling direction of the light at a frequency of the optical wave and in which the amplitude thereof is constant irrespective of the vibration direction. In other words, circularly polarized light is light in which vibration of an electric field (or a magnetic field) propagates while forming a circle.

Light Receiving Portion

The light receiving portion 4 has a function of detecting the intensity of the light LLs (in particular, the resonance light pair including the first resonance light and the second resonance light) having passed through the inside of the atom cell 2.

The light receiving portion 4 is not particularly limited as long as it can detect the intensity of the light LLs. For example, a light detector (light receiving element) such as a photodiode which outputs a signal corresponding to the intensity of received light can be used.

Heater

The heater 5 (heating portion) has a function of heating the atom cell 2 (more specifically, the alkali metal in the atom cell 2). As a result, the alkali metal in the atom cell 2 can be maintained in the gaseous state at an appropriate concentration.

The heater 5 is configured to include, for example, a heating resistor that generates heat by applying a current thereto. The heating resistor may be provided in contact or non-contact with the atom cell 2.

More specifically, for example, in a case where the heating resistor is in contact with the atom cell 2, the heating resistor is provided at the pair of window portions of the atom cell 2. As a result, condensation of the alkali metal atoms in the window portions of the atom cell 2 can be prevented. As a result, excellent characteristics (oscillation characteristics) of the atomic oscillator 1 can be maintained for a long period of time. The heating resistor is formed of a material having transparency to the light LL, specifically, for example, a transparent electrode material such as an oxide including indium tin oxide (ITO), indium zinc oxide (IZO), $In_2O_3$, $SnO_2$, Sb-containing $SnO_2$, and Al-containing ZnO. In addition, the heating resistor can be formed using a chemical vapor deposition (CVD) method such plasma CVD or thermal CVD, a dry plating method such as vacuum deposition, or a sol-gel method.

In addition, in a case where the heating resistor is provided in non-contact with the atom cell 2, heat may be conducted from the heating resistor to the atom cell 2 through a member formed of a metal or a ceramic having high thermal conductivity.

The heater 5 is not limited to the above-described configuration as long as it can heat the atom cell 2, and various heaters can be used. In addition, a Peltier element may be used instead of or in combination with the heater 5 to adjust the temperature of the atom cell 2.

Temperature Sensor

The temperature sensor 6 has a function of detecting the temperature of the heater 5 or the atom cell 2. This temperature sensor 6 is disposed, for example, in contact with the heater 5 or the atom cell 2.

The temperature sensor 6 is not particularly limited, and various well-known temperature sensors such as a thermistor or a thermocouple can be used.

Magnetic Field Generating Portion

The magnetic field generating portion 7 has a function of applying a magnetic field to the alkali metal in the atom cell 2. As a result, due to Zeeman splitting, gaps between plural different degenerated energy levels of the alkali metal atoms in the atom cell 2 are widened such that the resolution can be improved. As a result, the accuracy of the oscillation frequency of the atomic oscillator 1 can be improved.

For example, the magnetic field generating portion 7 may be configured as a solenoid type by a coil wound around an outer circumference of the atom cell 2, or may be configured as a Helmholtz type by a pair of coils provided opposite to each other with the atom cell 2 interposed therebetween.

In addition, a magnetic field generated by the magnetic field generating portion 7 is a constant magnetic field (DC magnetic field) but an AC magnetic field may be superimposed thereon.

Control Portion

The control portion 8 has a function of controlling the light source portion 3, the heater 5, and the magnetic field generating portion 7.

The control portion 8 includes: a light source control portion 82 that controls the light source portion 3; a temperature control portion 81 that controls the temperature of the alkali metal in the atom cell 2; and a magnetic field control portion 83 that controls the magnetic field generated by the magnetic field generating portion 7.

The light source control portion 82 has a function of controlling the frequencies of the first resonance light and the second resonance light emitted from the light source portion 3 based on the detection result of the light receiving portion 4. More specifically, the light source control portion 82 controls the frequencies of the first resonance light and the second resonance light emitted from the light source portion 3 such that the difference in frequency ($\omega_1-\omega_2$) is the frequency $\omega_0$ peculiar to the alkali metal. The configuration of the light source control portion 82 will be described below in detail.

In addition, the temperature control portion 81 controls the current application to the heater 5 based on the detection result of the temperature sensor 6. As a result, the temperature of the atom cell 2 can be maintained in a desired temperature range. For example, the temperature of the atom cell 2 can be adjusted to be, for example, about 70° C. by the heater 5.

In addition, the magnetic field control portion 83 controls the current application to the magnetic field generating portion 7 such that the magnetic field generated by the magnetic field generating portion 7 is constant.

The control portion 8 is provided, for example, on an IC chip mounted on a substrate.

Hereinabove, the configuration of the atomic oscillator 1 has been simply described.

The above-described configuration is applicable to a quantum interference device, in which the quantum interference device described herein includes at least: the gaseous alkali metal; the light source portion 3 for generating the resonance light pair having different frequencies in which a difference in frequency corresponding to the energy difference $\Delta E$ between two ground levels of the alkali metal is maintained; the light receiving portion 4 that detects the resonance light; and the atom cell 2 that encapsulates the alkali metal, and has a portion where the alkali metal and the resonance light pair interact with each other to cause the electromagnetically induced transparency phenomenon.

Detailed Description of Light Source Portion

Figure 4:
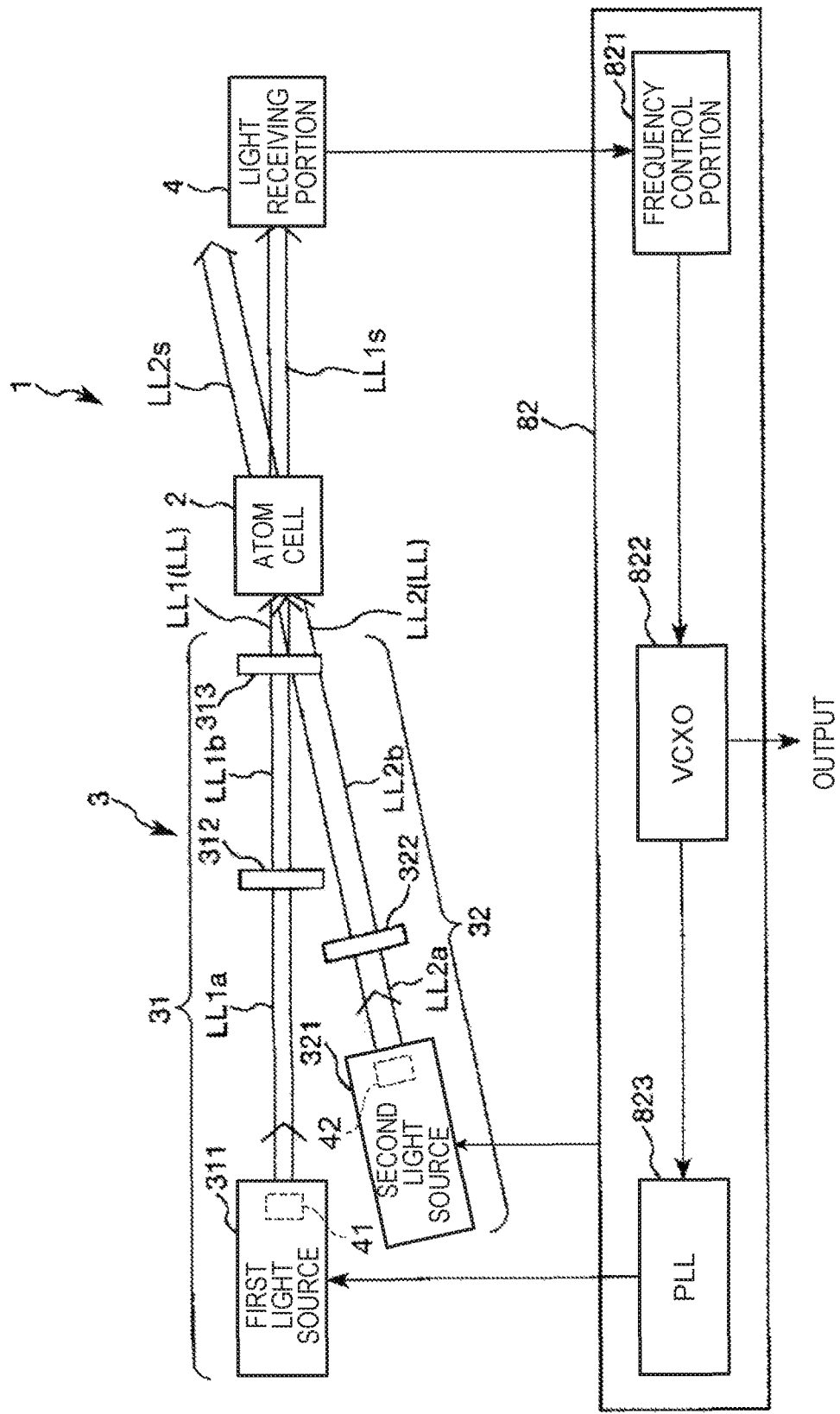
FIG. 4 is a schematic diagram showing the light source portion included in the atomic oscillator shown in FIG. 1.
Figure 7:
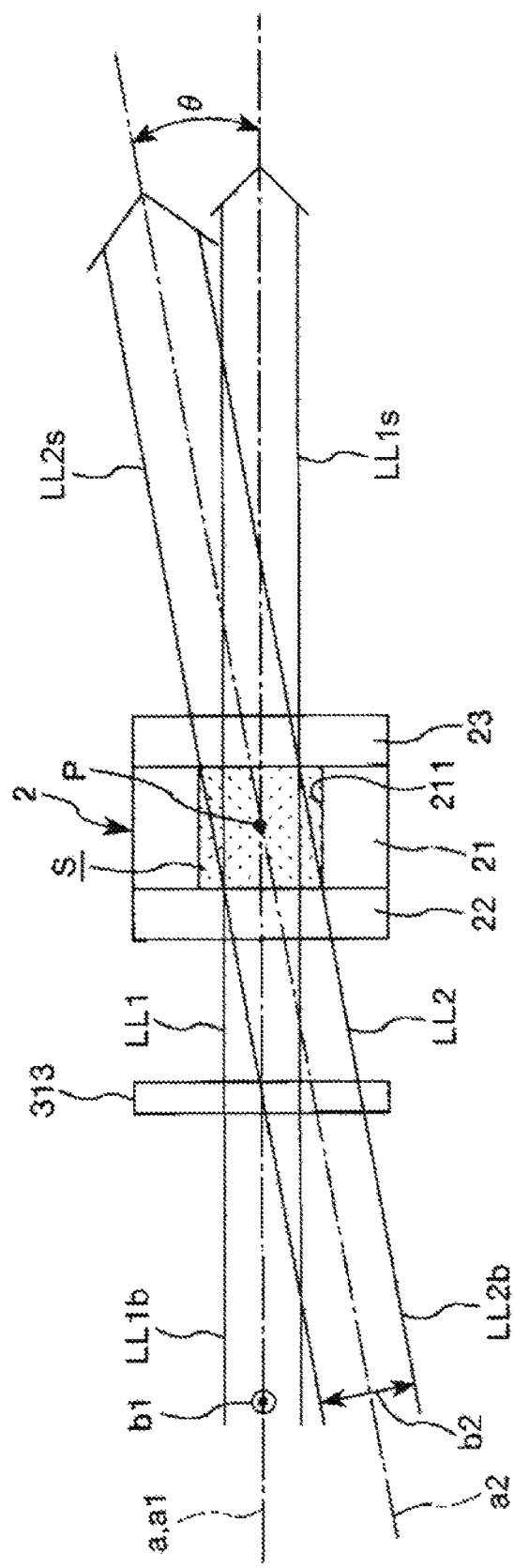
FIG. 7 is a diagram showing two kinds of light emitted from a first light source portion and a second light source portion of the light source portion shown in FIG. 4.
Figure 8:
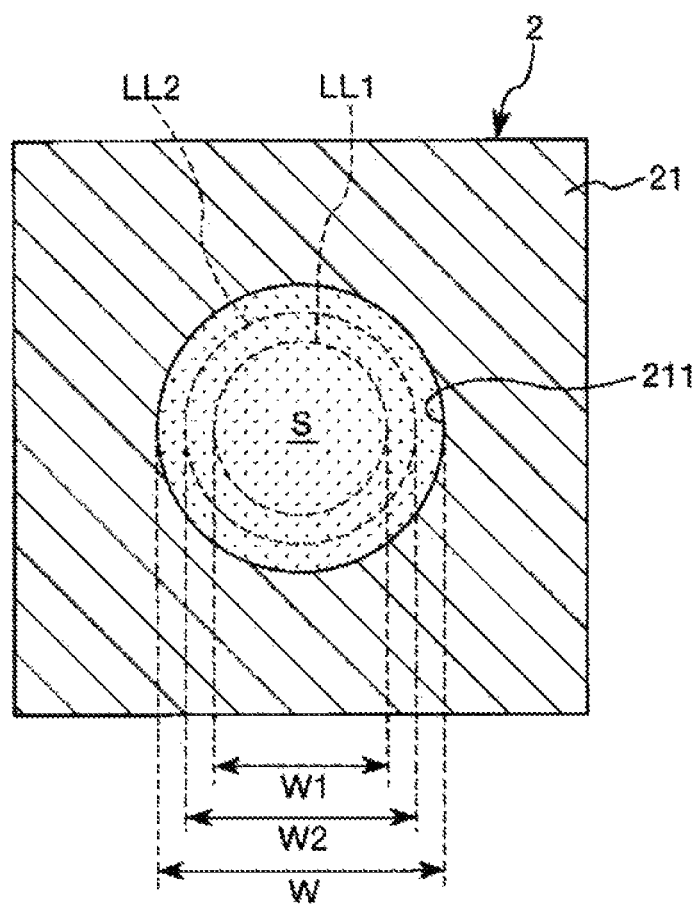
FIG. 8 is a cross-sectional view showing an atom cell shown in FIG. 7.

FIG. 4 is a schematic diagram showing the light source portion included in the atomic oscillator shown in FIG. 1. FIG. 7 is a diagram showing two kinds of light emitted from a first light source portion and a second light source portion of the light source portion shown in FIG. 4. FIG. 8 is a cross-sectional view showing the atom cell shown in FIG. 7, that is a cross-sectional view perpendicular to a direction in which the pair of window portions are disposed.

As shown in FIG. 4, the light source portion 3 includes: a first light source portion 31 that emits, as first light, resonance light pair LL1 including the first resonance light and the second resonance light; and a second light source portion 32 that emits, as second light, adjustment light LL2 including the third resonance light.

The first light source portion 31 includes a first light source 311, a λ/2 wave plate 312, and a λ/4 wave plate 313. The λ/2 wave plate 312 and the λ/4 wave plate 313 are disposed between the first light source 311 and the atom cell 2.

The first light source 311 has a function of emitting first light LL1a including the linearly polarized resonance light pair. The first light source 311 includes a first surface emitting laser 41 that oscillates at a wavelength of 895 nm and emits light including the first light LL1a. The first light source 311 is not particularly limited as long as it can emit the light including the first light LL1a. For example, a semiconductor laser such as an edge emitting laser or a vertical cavity surface emitting laser (VCSEL) may be used. "Linearly polarized light" refers to light in which a vibration plane of an electromagnetic wave (light) is in a plane, in other words, a vibration direction of an electric field (or a magnetic field) is constant.

The λ/2 wave plate 312 is a birefringent element that generates a phase difference π (180°) between polarized components perpendicular to each other. Therefore, the λ/2 wave plate 312 changes a polarization direction of the linearly polarized first light LL1a, which is emitted from the first light source 311, by 90° to generate a resonance light pair LL1b. In a case where the first light source 311 is provided to be rotated by 90° with respect to an optical axis, the polarization direction of the linearly polarized light emitted from the first light source 311 is perpendicular to that of linearly polarized light emitted from the second light source 321. Therefore, the λ/2 wave plate 312 is not necessarily provided.

The λ/4 wave plate 313 is a birefringent element that generates a phase difference π/2 (90°) between polarized components perpendicular to each other. The λ/4 wave plate 313 has a function of converting the linearly polarized resonance light pair LL1b, which is generated by the λ/2 wave plate 312, into the circularly polarized (or elliptically polarized) resonance light pair LL1. As a result, the resonance light pair LL1 including the first resonance light and the second resonance light can be generated.

On the other hand, the second light source portion 32 includes a second light source 321, a neutral density filter 322, and the λ/4 wave plate 313 that is shared by the first light source portion 31. The neutral density filter 322 and the λ/4 wave plate 313 are disposed between the second light source 321 and the atom cell 2. Here, it can be said that the λ/4 wave plate 313 is included in the first light source portion 31 or in the second light source portion 32. Therefore, two kinds of light emitted from the first light source 311 and the second light source 321 pass through the λ/4 wave plate 313. Thus, the device configuration can be simplified.

The second light source 321 has a function of emitting second light LL2a including resonance light which is linearly polarized in the same direction as in the first light source 311. The second light source 321 includes a second surface emitting laser 42 that oscillates at a wavelength of 852 nm and emits light including the second light LL2a. The second light source 321 is not particularly limited as long as it can emit the light including the second light LL2a. For example, a semiconductor laser such as an edge emitting laser or a vertical cavity surface emitting laser (VCSEL), or a light emitting element such as a light emitting diode (LED) or an organic electroluminescence (organic EL) element may be used.

Here, the wavelength 852 nm of the second light LL2a which oscillates and is emitted from the second surface emitting laser 42 is different from the wavelength 895 nm of the first light LL1a which oscillates and is emitted from the first surface emitting laser 41. That is, the wavelength of the adjustment light LL2 is separated from the wavelength of the resonance light pair LL1. Therefore, the generation of an unnecessary signal by the adjustment light LL2 can be reduced.

The neutral density filter 322 (ND filter) reduces the intensity of the second light LL2a emitted from the second light source 321 to generate the resonance light LL2b. As a result, even in a case where the output of the second light source 321 is high, the intensity of the adjustment light LL2 incident on the atom cell 2 can be adjusted to be a desired value. For example, in a case where the output of the second light source 321 is lower than that of the first light source 311, the neutral density filter 322 is not necessarily provided.

As described above, the λ/4 wave plate 313 is a birefringent element that generates a phase difference π/2 (90° between polarized components perpendicular to each other. The λ/4 wave plate 313 has a function of converting the linearly polarized resonance light pair LL2b, which is generated by the neutral density filter 322, into the circularly polarized (or elliptically polarized) adjustment light LL2. As a result, the adjustment light LL2 including the third resonance light can be generated. Here, the polarization direction (b2 direction in FIG. 7) of the linearly polarized resonance light LL2b is different from (perpendicular to) the polarization direction (b1 direction in FIG. 7) of the linearly polarized resonance light pair LL1b. Therefore, by allowing the resonance light pair LL1b and the resonance light LL2b to pass through the shared λ/4 wave plate 313, the circularly polarized resonance light pair LL1 and the adjustment light LL2 which is circularly polarized in a direction opposite to the resonance light pair LL1 can be generated. In this way, the first light source portion 31 and the second light source portion 32 have the shared λ/4 wave plate 313 through which the resonance light pair LL1 and the adjustment light LL2 pass. Therefore, the device configuration can be simplified as compared to a case where the first light source portion 31 and the second light source portion 32 have λ/4 wave plates, respectively.

In the light source portion 3 configured as described above, the first light source 311 is controlled by the light source control portion 82 so as to emit the first resonance light and the second resonance light.

The light source control portion 82 includes a frequency control portion 821, a voltage controlled crystal oscillator (VCXO) 822, and a phase locked loop (PLL) 823.

The frequency control portion 821 detects an EIT state in the atom cell 2 based on the intensity of the light received by the light receiving portion 4, and outputs a controlled signal corresponding to the detection result. As a result, the frequency control portion 821 controls the voltage controlled crystal oscillator 822 such that an EIT signal is detected by the light receiving portion 4.

The voltage controlled crystal oscillator 822 is controlled by the frequency control portion 821 so as to oscillate at a desired oscillation frequency. For example, the frequency is several MHz to several tens of MHz. In addition, an output signal of the voltage controlled crystal oscillator 822 is input to the phase locked loop 823 and is output as an output signal of the atomic oscillator 1.

The phase locked loop 823 multiplies the frequency of the signal output from the voltage controlled crystal oscillator 822. As a result, the phase locked loop 823 oscillates at a frequency which is half of the frequency corresponding to the energy difference $\Delta E$ between the two different ground levels of the alkali metal atoms. This multiplied signal (high-frequency signal) is input to the first light source 311 of the first light source portion 31 as a driving signal after a DC bias voltage is superimposed thereon. As a result, the first surface emitting laser 41 included in the first light source 311 is modulated so as to emit the first resonance light and the second resonance light as two kinds of light in which a difference in frequency $(\omega_1 - \omega_2)$ is $\omega_0$. Here, a current value of the DC bias voltage is controlled by a bias control portion (not shown) to be a predetermined value. As a result, central wavelengths of the first resonance light and the second resonance light can be controlled.

Next, a method of adjusting a central wavelength of the adjustment light LL2, which is the third resonance light emitted from the second light source 321, will be described with reference to FIGS. 5 and 6.

Figure 5:
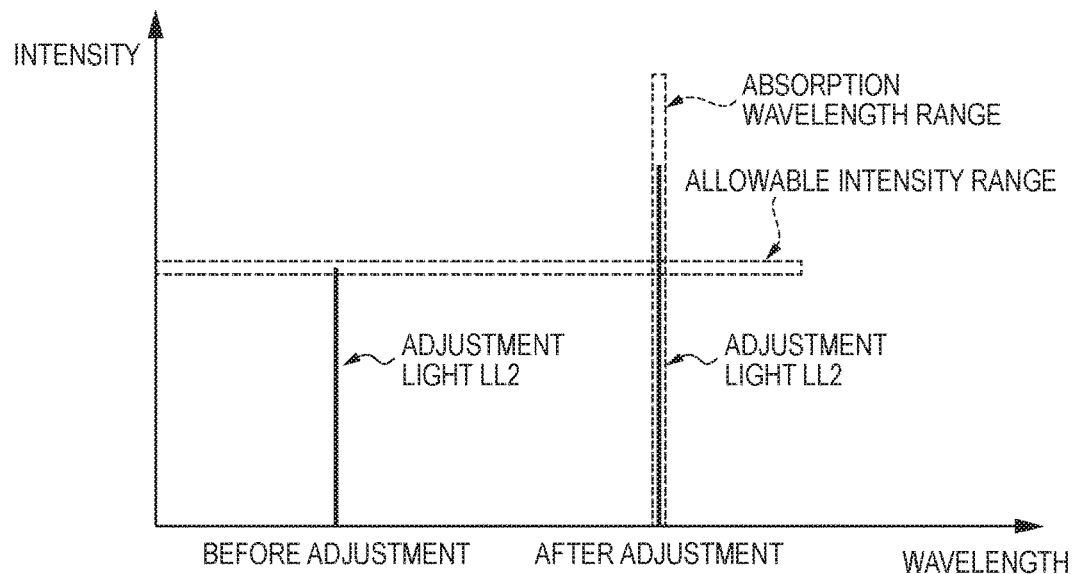
FIG. 5 is a diagram showing wavelength spectra before and after wavelength adjustment of adjustment light in a case where the adjustment light is not FM-modulated.
Figure 6:
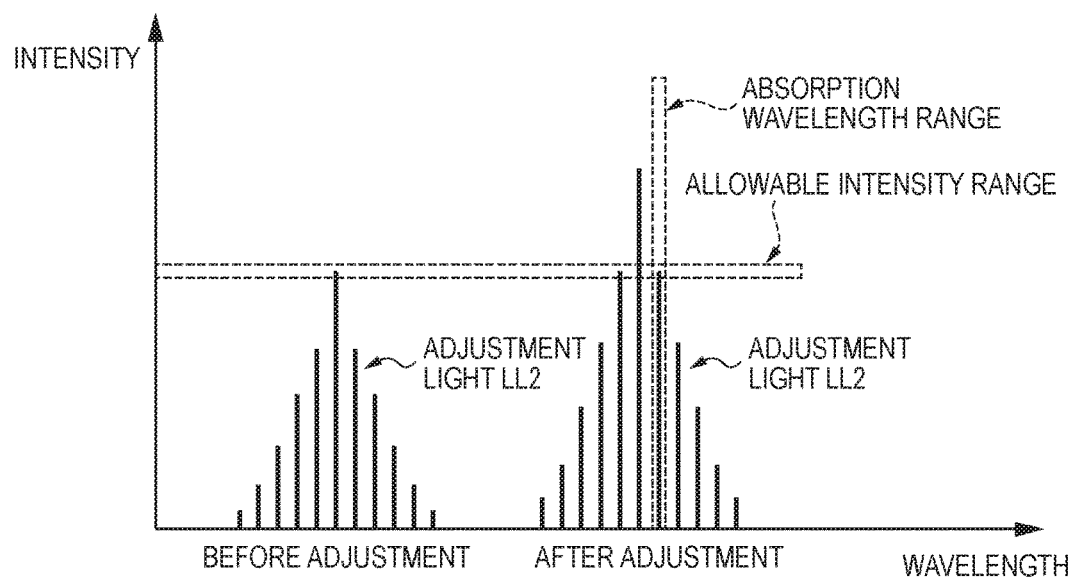
FIG. 6 is a diagram showing wavelength spectra before and after wavelength adjustment of adjustment light in a case where the adjustment light is FM-modulated.

FIG. 5 is a diagram showing wavelength spectra before and after wavelength adjustment of the adjustment light in a case where the adjustment light is not FM-modulated. FIG. 6 is a diagram showing wavelength spectra before and after wavelength adjustment of the adjustment light in a case where the adjustment light is FM-modulated.

The central wavelength of the adjustment light LL2 emitted from the second light source 321 can be controlled to a desired value by adjusting a driving current of the second light source 321. However, in a case where the driving current is adjusted, not only the central wavelength of the adjustment light LL2 but also the intensity of the adjustment light LL2 change. For example, in a case where the driving current increases, the central wavelength of the adjustment light LL2 increases, and the intensity of the adjustment light LL2 also increases. Therefore, as shown in FIG. 5, in a case where the central wavelength of the adjustment light LL2 is controlled to be in a desired absorption wavelength range of the metal (for example, a wavelength width of about 2.4 pm, a frequency of about 1 GHz), the intensity of the adjustment light LL2 is higher than an allowable intensity range. In a case where the intensity of the adjustment light LL2 is excessively high (strong), as described below, a distribution of magnetic quantum numbers of the alkali metal in the atom cell 2 is significantly biased to a side opposite to bias of a distribution of magnetic quantum numbers caused by the resonance light pair LL1. Therefore, the bias of magnetic quantum numbers caused by the resonance light pair LL1 cannot be sufficiently cancelled out or alleviated by the adjustment light LL2.

Therefore, by FM-modulating the second surface emitting laser 42 included in the second light source 321 using a FM modulation portion (not shown) which is provided inside the light source control portion 82, plural wavelength spectra can be generated by the FM modulation on both sides of the central wavelength of the adjustment light LL2 in the wavelength spectrum of the adjustment light LL2. For example, in a case where the FM modulation is performed at 100 MHz, ten wavelength spectra are obtained at an interval of 0.24 pm, and ten wavelength spectra are in the desired absorption wavelength range of the metal (a wavelength width of about 2.4 pm). The intensities of the plural wavelength spectra of the adjustment light LL2 decrease in a direction away from the central wavelength of the adjustment light LL2. Therefore, by adjusting the driving current of the second light source 321, as shown in FIG. 6, one of the plural wavelength spectra of the adjustment light LL2 can be adjusted in a desired wavelength width of an absorption wavelength range of the metal and in an allowable intensity range. Accordingly, by FM-modulating the adjustment light LL2, the number of metal atoms having desired magnetic quantum numbers in the atom cell 2 can be increased, and the intensity of an EIT signal can be improved.

Here, the frequency at which the adjustment light LL2 is FM-modulated is lower than the frequency which is the wavelength width of an absorption wavelength range of the metal. As a result, at least one of plural wavelength spectra of the FM-modulated adjustment light LL2 can be easily adjusted in a wavelength width of an absorption wavelength range of the metal which is desired to cause the metal to resonate and in an allowable intensity range. Therefore, the number of metal atoms having desired magnetic quantum numbers contributing to EIT can be increased. As a result, an effect of improving the intensity of an EIT signal can be significantly exhibited. Thus, the intensity of an EIT signal can be effectively improved.

The atom cell 2 is irradiated with the resonance light pair LL1 and the adjustment light LL2 emitted from the first light source portion 31 and the second light source portion 32 configured as described above.

As shown in FIG. 7, the atom cell 2 includes a body portion 21 and a pair of window portions 22 and 23 that are provided with the body portion 21 interposed therebetween. In the atom cell 2, the body portion 21 is disposed between the pair of window portions 22 and 23, and an internal space S in which the gaseous alkali metal is encapsulated is partitioned (configured) by the body portion 21 and the pair of window portions 22 and 23.

More specifically, the body portion 21 is formed in a plate shape, in which through holes 211 are formed so as to penetrate in a thickness direction of the body portion 21.

A constituent material of the body portion 21 is not particularly limited, and examples thereof include a glass material, quartz crystal, a metal material, a resin material, and a silicon material. Among these, any one of a glass material, quartz crystal, and a silicone material is preferably used, and a silicone material is more preferably used. As a result, even in a case where a small atom cell 2 having a width or height of 10 mm or less is formed, the high-accuracy body portion 21 can be easily formed using a microfabrication technique such as etching. In particular, microfabrication such as etching can be performed on silicon. Therefore, by forming the body portion 21 using silicon, the body portion 21 can be simply and accurately formed even in a case where an attempt to reduce the size of the atom cell 2 is made. In addition, in general, the window portions 22 and 23 are formed of glass, and silicon has hither thermal conductivity than glass. Therefore, the body portion 21 can be made to have excellent heat dissipation. In addition, in a case where the window portions 22 and 23 are formed of glass, the body portion 21 and the window portions 22 and 23 can be air-tightly bonded to each other simply by anodic bonding, and thus the atom cell 2 can be made to have high reliability.

The window portion 22 is bonded to one surface of the body portion 21, and the window portion 23 is bonded to the other surface of the body portion 21. As a result, one end opening of the through hole 211 is blocked by the window portion 22, and the other opening of the through hole 211 is blocked by the window portion 23.

A method of bonding the body portion 21 and the window portions 22 and 23 to each other is determined according to constituent materials thereof and is not particularly limited as long as the body portion 21 and the window portions 22 and 23 can be air-tightly bonded to each other. For example, a bonding method using an adhesive, a direct bonding method, an anodic bonding method, or a surface activated bonding method can be used. Among these, a direct bonding method or an anodic bonding method is preferable. As a result, the body portion 21 and the window portions 22 and 23 can be air-tightly bonded to each other simply, and thus the atom cell 2 can be made to have high reliability.

Each of the window portions 22 and 23 bonded to the body portion 21 has transparency to the light LL emitted from the light source portion 3. The window portion 22 is an entrance-side window portion through which the light LL enters into the internal space S of the atom cell 2, and the window portion 23 is an exit-side window portion through which the light LL exits from the internal space S of the atom cell 2. In addition, the window portions 22 and 23 are formed in a plate shape, respectively.

A constituent material of the window portions 22 and 23 is not particularly limited as long as it has transparency to the light LL. For example, a glass material or crystal may be used, and a glass material is preferably used. As a result, the window portions 22 and 23 having transparency to excitation light can be realized. In addition, in a case where the body portion 21 is formed of silicon, the window portions 22 and 23 are formed of glass. As a result, the body portion 21 and the window portion 22 can be air-tightly bonded to each other simply by anodic bonding, and thus the atom cell 2 can be made to have high reliability. Depending on the thicknesses of the window portions 22 and 23 and the intensity of the light LL, the window portions 22 and 23 can be formed of silicon. Even in this case, the body portion 21 and the window portions 22 and 23 can be bonded to each other by direct bonding or anodic bonding.

In the internal space S which is the space in the through hole 211 blocked by the window portions 22 and 23, mainly, the gaseous alkali metal is stored. The gaseous alkali metal stored in the internal space S is excited by the light LL. Here, at least a part of the internal space S forms "light passing space" through which the light LL passes. In the embodiment, a cross-section of the internal space S has a circular shape. On the other hand, a cross-section of the light passing space has a shape (that is, a circular shape) similar to the cross-section of the internal space S and is set to be slightly smaller than the cross-section of the internal space S. The cross-sectional shape of the internal space S is not limited to a circular shape and may be, for example, a polygonal shape such as a tetragonal shape or a pentagonal shape or an elliptical shape.

In the atom cell 2 configured as described above, as shown in FIG. 7, an optical axis a1 of the resonance light pair LL1 is inclined with respect to an optical axis a2 of the adjustment light LL2 by an inclination angle θ and intersects with the optical axis a2 at an intersection point P. In addition, in FIG. 7, in the atom cell 2, the optical axis a1 of the resonance light pair LL1 is parallel to an axis a along a direction in which the window portions 22 and 23 of the atom cell 2 are disposed. On the other hand, the optical axis a2 of the adjustment light LL2 is inclined with respect to the axis a by the inclination angle θ. In FIG. 7, the optical axis a1 matches with the axis a.

Here, on a side of the atom cell 2 where the resonance light pair LL1 and the adjustment light LL2 pass, the light receiving portion 4 is disposed on the optical axis a1 or a line extending from the optical axis a1, and the resonance light pair LL1s having passed through the atom cell 2 is received by the light receiving portion 4. On the other hand, the optical axis a2 is set such that the adjustment light LL2s having passed through the atom cell 2 is not received by the light receiving portion 4. As a result, the reception of the adjustment light LL2s by the light receiving portion 4 can be prevented or reduced.

In the embodiment, the adjustment light LL2s having passed through the atom cell 2 is incident on an antireflection portion (not shown) so as not to be strayed. The adjustment light LL2s having passed through the atom cell 2 may be received by a light receiving element, and the second light source portion 32 may be controlled based on the detection result of the light receiving element.

In addition, as shown in FIG. 8, in the atom cell 2, a width W2 of the adjustment light LL2 is larger than a width W1 of the resonance light pair LL1. As a result, in the atom cell 2, a passing region of the resonance light pair LL1 is included in a passing region of the adjustment light LL2.

In addition, the width W2 of the adjustment light LL2 is also smaller than a width W in the atom cell 2.

Figure 9:
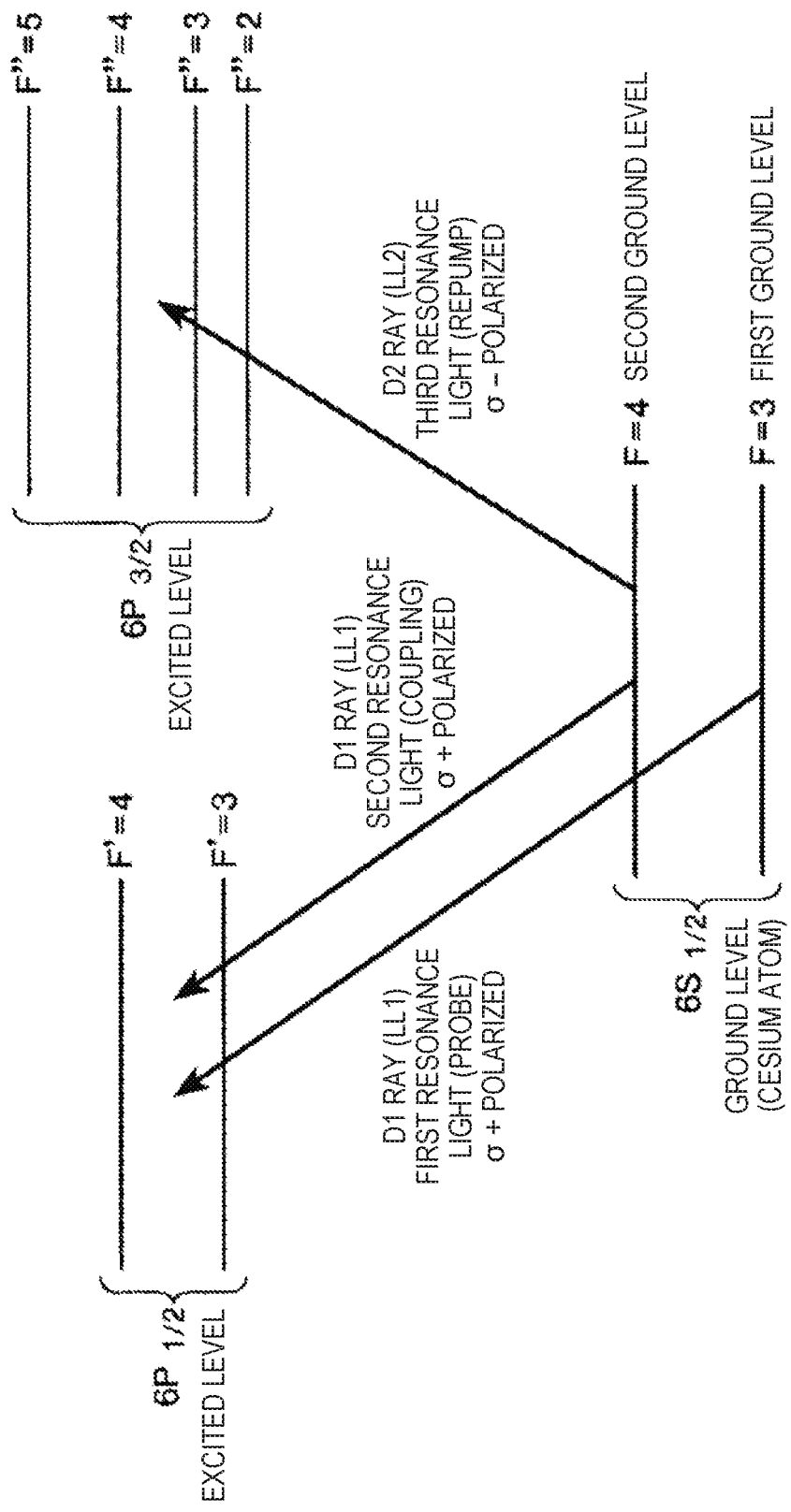
FIG. 9 is a diagram showing an example of a relationship between energy states of cesium atoms, and a resonance light pair (first resonance light and second resonance light) and adjustment light (third resonance light).

FIG. 9 is a diagram showing an example of a relationship between energy states of cesium atoms, and the resonance light pair (first resonance light and second resonance light) and the adjustment light (third resonance light).

For example, in a case where the atom cell 2 encapsulates cesium atoms, as shown in FIG. 9, a σ+ polarized (left-handed circularly polarized) D1 ray is used as the first resonance light and the second resonance light (resonance light pair), and a σ− polarized (right-handed circularly polarized) D2 ray is used as the third resonance light (adjustment light). In addition, the first resonance light and the second resonance light may be σ− polarized, and the third resonance light may be σ+ polarized. In addition, the D2 ray may be used as the first resonance light and the second resonance light, and the D1 ray may be used as the third resonance light.

Cesium atoms which are one kind of alkali metal atoms have a ground level of $6S_{1/2}$ and two excited levels of $6P_{1/2}$ and $6P_{3/2}$. In addition, each level of $6S_{1/2}$, $6P_{1/2}$, and 6P3/2 has a fine structure in which plural energy levels are split. Specifically, the level $6S_{1/2}$ has two ground levels F=3 and F=4, the level $6P_{1/2}$ has two excited levels F'=3 and F'=4, and the level $6P_{3/2}$ has four excited levels F''=2, F''=3, F''=4, and F''=5.

By cesium atoms in the first ground level F=3 of $6S_{1/2}$ absorbing the D2 ray, the energy level can be transitioned into any one of the excited levels F''=2, F''=3, and F''=4 of $6P_{3/2}$ but cannot be transitioned into the excited level F''=5. By cesium atoms in the second ground level F=4 of $6S_{1/2}$ absorbing the D2 ray, the energy level can be transitioned into any one of the excited levels F''=3, F''=4, and F''=5 of $6P_{3/2}$ but cannot be transitioned into the excited level F''=2. These transitions are based on a transition selection rule on the assumption of electric dipole transition. Conversely, cesium atoms in any one of the excited levels F''=3 and F''=4 of $6P_{3/2}$ emit the D2 ray and can be transitioned into the ground level F=3 or F=4 of $6S_{1/2}$ (the original ground level or another ground level). Three levels consisting of the two ground levels F=3 and F=4 of $6S_{1/2}$ and any one of the excited levels F''=3 and F''=4 of $6P_{3/2}$ are called Λ-type three levels because Λ-type transition by absorption and emission of the D2 ray is possible. Three levels consisting of the two ground levels F=3 and F=4 of $6S_{1/2}$ and any one of the excited levels F'=3 and F'=4 of $6P_{1/2}$ also form Λ-type three levels because Λ-type transition by absorption and emission of the D1 ray is possible.

On the other hand, cesium atoms in the excited level F"=2 of $6P_{3/2}$ emit the D2 ray and are necessarily transitioned into the ground level (original ground level) F=3 of $6S_{1/2}$. Likewise, cesium atoms in the excited level F"=5 of $6P_{3/2}$ emit the D2 ray and are necessarily transitioned into the ground level (original ground level) F=4 of $6S_{1/2}$. Three levels consisting of the two ground levels F=3 and F=4 of $6S_{1/2}$ and the excited level F"=2 or F"=5 of $6P_{3/2}$ do not form Λ-type three levels because Λ-type transition by absorption and emission of the D2 ray is impossible.

In the cesium atoms, the wavelength of the D1 ray in a vacuum is 894.593 nm, the wavelength of the D2 ray in a vacuum is 892.347 nm, and a hyperfine splitting frequency (ΔE) of $6S_{1/2}$ is 9.1926 GHz.

Likewise, alkali metal atoms other than cesium atoms have two ground levels and an excited level forming Λ-type three levels. Here, in sodium atoms, the wavelength of the D1 ray in a vacuum is 589.756 nm, the wavelength of the D2 ray in a vacuum is 589.158 nm, and a hyperfine splitting frequency (ΔE) of $3S_{1/2}$ is 1.7716 GHz. Here, in rubidium (85Rb) atoms, the wavelength of the D1 ray in a vacuum is 794.979 nm, the wavelength of the D2 ray in a vacuum is 780.241 nm, and a hyperfine splitting frequency (ΔE) of $5S_{1/2}$ is 3.0357 GHz. In addition, in rubidium (87Rb) atoms, the wavelength of the D1 ray in a vacuum is 794.979 nm, the wavelength of the D2 ray in a vacuum is 780.241 nm, and a hyperfine splitting frequency (ΔE) of $5S_{1/2}$ is 6.8346 GHz.

Figure 10:
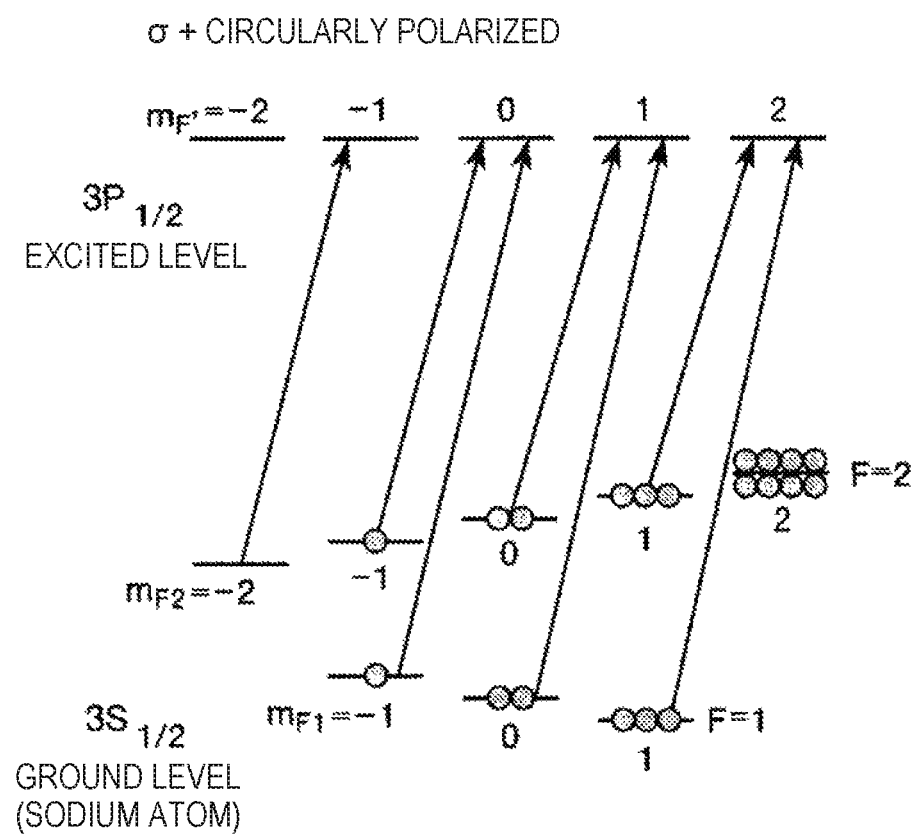
FIG. 10 is a diagram showing a distribution of magnetic quantum numbers of sodium atoms in a case where the sodium atoms are irradiated with σ+ circularly polarized resonance light.
Figure 11:
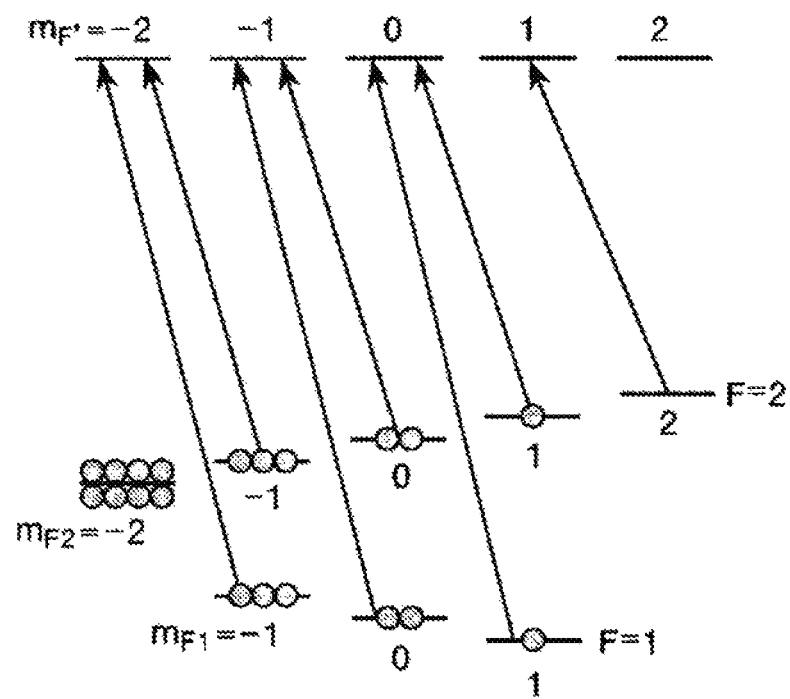
FIG. 11 is a diagram showing a distribution of magnetic quantum numbers of sodium atoms in a case where the sodium atoms are irradiated with σ− circularly polarized resonance light.

FIGS. 10 and 11 are diagrams showing a distribution of magnetic quantum numbers of sodium atoms, FIG. 10 is a diagram showing the distribution in a case where the sodium atoms are irradiated with σ+ circularly polarized resonance light, and FIG. 11 is a diagram showing the distribution in a case where the sodium atoms are irradiated with σ− circularly polarized resonance light.

For example, as shown in FIGS. 10 and 11, sodium atoms which are alkali metal atoms have two ground levels and an excited level forming Λ-type three levels, a first ground level F=1 of $3S_{1/2}$ has three magnetic quantum numbers mF1 of −1, 0, and 1, a second ground level F=2 of $3S_{1/2}$ has five magnetic quantum numbers mF2 of −2, −1, 0, 1 and 2, and an excited level $3P_{1/2}$ has five magnetic quantum numbers mF' of −2, −1, 0, 1 and 2.

In a case where sodium atoms in the ground level F=1 or F=2 are irradiated with the σ+ circularly polarized resonance light pair, as shown in FIG. 10, the sodium atoms are excited to the excited level based on a selection rule in which the magnetic quantum numbers are increased by 1. At this time, a distribution of magnetic quantum numbers of the sodium atoms in the ground level F=1 or F=2 changes to an increasing side.

In a case where sodium atoms in the ground level F=1 or F=2 are irradiated with the σ− circularly polarized resonance light pair, as shown in FIG. 11, the sodium atoms are excited to the excited level based on a selection rule in which the magnetic quantum numbers are decreased by 1. At this time, a distribution of magnetic quantum numbers of the sodium atoms in the ground level F=1 or F=2 changes to a decreasing side.

For convenience of description, FIGS. 10 and 11 show a distribution of magnetic quantum numbers by using sodium atoms having a simple structure as an example. However, in another alkali metal atoms, each of ground levels and an excited level has 2F+1 magnetic quantum numbers (magnetic sublevels), and a distribution of magnetic quantum numbers changes based on the above-described selection rule.

Figure 12:
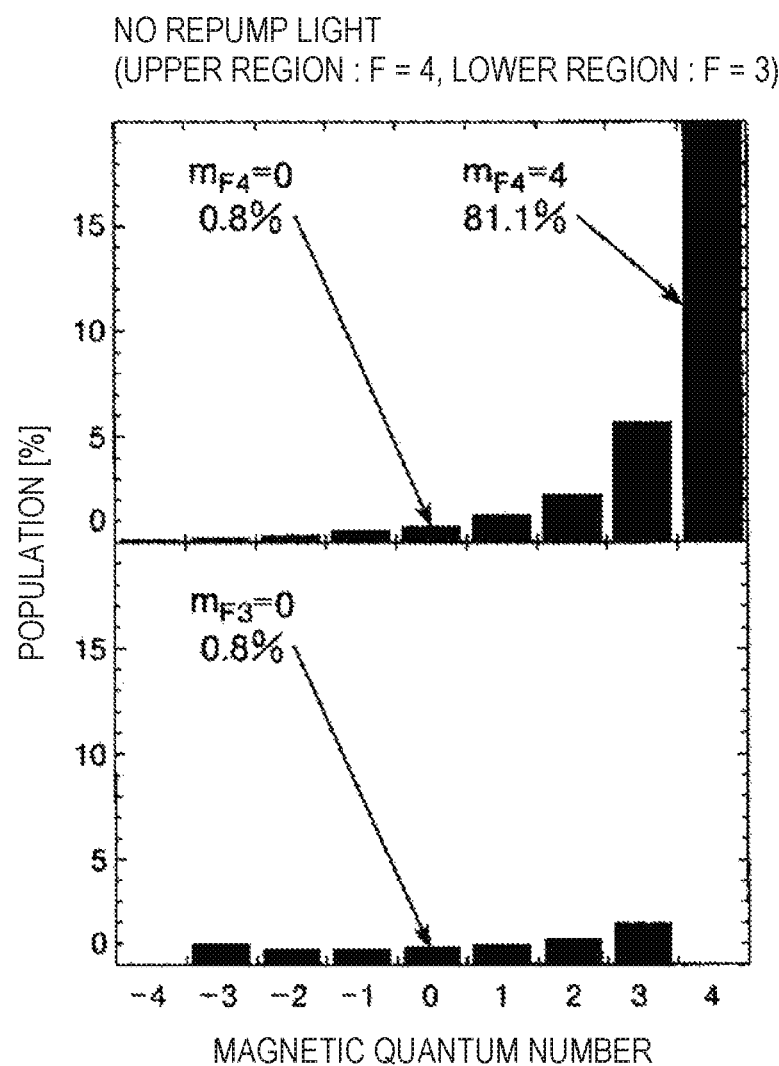
FIG. 12 is a graph showing a distribution of magnetic quantum numbers of cesium atoms in a case where the cesium atoms are irradiated with only the resonance light pair.
Figure 13:
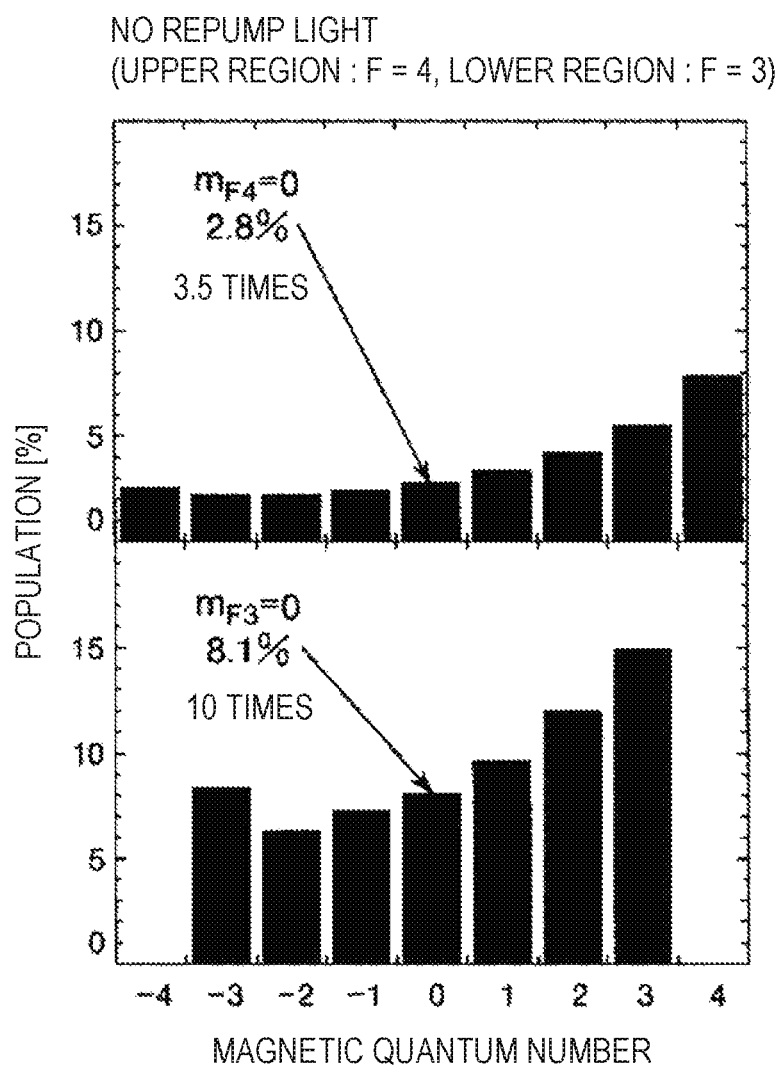
FIG. 13 is a graph showing a distribution of magnetic quantum numbers of cesium atoms in a case where the cesium atoms are irradiated with the resonance light pair and the adjustment light.

FIGS. 12 and 13 are graphs showing a distribution of magnetic quantum numbers of cesium atoms, FIG. 12 is a graph showing the distribution in a case where the cesium atoms are irradiated with only the resonance light pair, and FIG. 13 is a graph showing the distribution in a case where the cesium atoms are irradiated with the resonance light pair and the adjustment light.

In a case where cesium atoms are irradiated with only the resonance light pair LL1, as shown in FIG. 12, the bias of a distribution of magnetic quantum numbers $m_{F3}$ of cesium atoms in the first ground level is small, but the number thereof is small. In addition, a distribution of magnetic quantum numbers $m_{F4}$ of cesium atoms in the second ground level is significantly biased to an increasing side.

That is, in an atomic oscillator of the related art (for example, the atomic oscillator disclosed in JP-A-2013-125907), all the rays of resonance light irradiating a metal are circularly polarized in one direction. Therefore, as compared to a case where the resonance light is linearly polarized, the intensity of an EIT signal can be improved, but the effect thereof is not sufficient. The reason for this is as follows. Since all the rays of the resonance light are circularly polarized in one direction, a distribution of magnetic quantum number of the metal is biased to either a decreasing side or an increasing side. As a result, the number of metal atoms having desired magnetic quantum numbers contributing to EIT is decreased.

On the other hand, in a case where cesium atoms are irradiated with the resonance light pair LL1 and the adjustment light LL2 at the same time, as shown in FIG. 13, the biases of distributions of magnetic quantum numbers $m_{F3}$ and $m_{F4}$ of the cesium atoms in the first ground level and the second ground level are relatively small, and the numbers thereof are relatively large. In particular, the number of cesium atoms in which magnetic quantum numbers $m_{F3}$ and $m_{F4}$ are 0 which are stable to a magnetic field can be increased. That is, in a case where cesium atoms are irradiated with the resonance light pair LL1 and the adjustment light LL2 at the same time, as compared to a case where cesium atoms are irradiated with only the resonance light pair LL1, a distribution of magnetic quantum numbers of the cesium atoms can be smoothened while increasing the number of cesium atoms in each of the first ground level and the second ground level.

Figure 14:
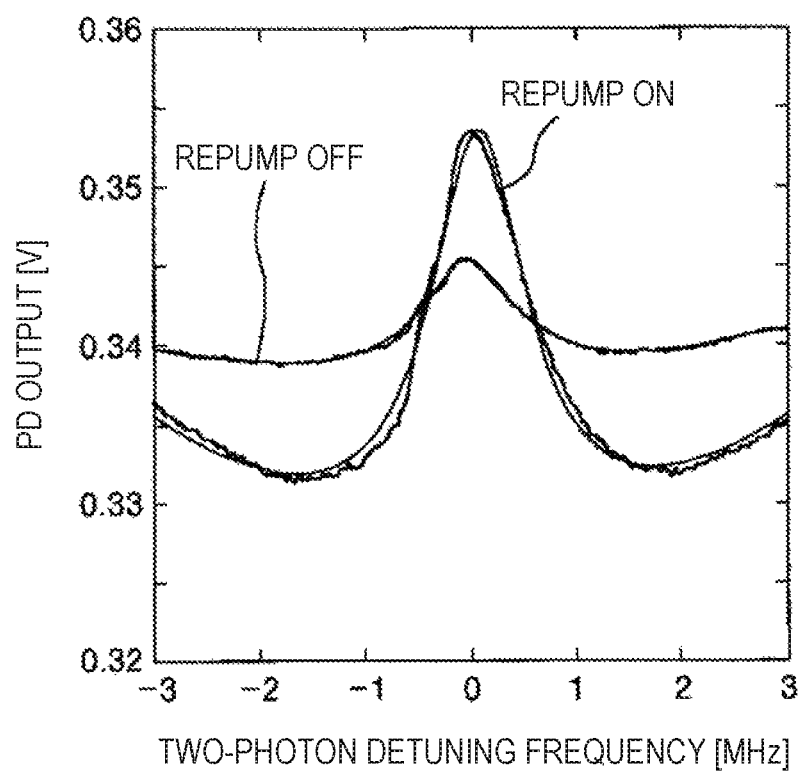
FIG. 14 is a graph showing a variation of an EIT signal depending on whether or not the adjustment light is irradiated.

FIG. 14 is a graph showing a variation of an EIT signal depending on whether or not the adjustment light is irradiated.

In a case where cesium atoms are irradiated with both the resonance light pair LL1 and the adjustment light LL2 at the same time (repump on) as shown in FIG. 14, as compared to a case where cesium atoms are irradiated with only the resonance light pair LL1, (repump off), the full widths at half maximum can be made to be substantially the same, and the intensity of an EIT signal can be increased to be about three times.

In the results shown in FIGS. 12, 13, and 14, the intensity (photon flux density) of the adjustment light in the atom cell 2 is reduced to about half of the intensity of the resonance light pair using the resonance light pair (the first resonance light and the second resonance light) and the adjustment light (the third resonance light) which are polarized as shown in FIG. 9.

As described above, in the atomic oscillator 1, the alkali metal is irradiated not only with the resonance light pair LL1 which is circularly polarized in the same direction but also with the adjustment light LL2 which is circularly polarized in a direction opposite to the resonance light pair LL1. As a result, bias of a distribution of magnetic quantum numbers caused by the resonance light pair LL1 can be cancelled out or alleviated by the adjustment light LL2, and thus bias of a distribution of magnetic quantum numbers of the alkali metal can be reduced. Therefore, the number of alkali metal atoms having desired magnetic quantum numbers contributing to EIT can be increased. As a result, an effect of improving the intensity of an EIT signal can be significantly exhibited by using the circularly polarized resonance light pair LL1. Thus, the intensity of an EIT signal can be effectively improved.

In addition, in a case where the intensity of the adjustment light LL2 is excessively strong, a distribution of magnetic quantum numbers of the alkali metal in the atom cell 2 may be significantly biased to a side opposite to bias of a distribution of magnetic quantum numbers caused by the resonance light pair LL1. On the other hand, in a case where the intensity of the adjustment light LL2 is excessively weak, the bias of magnetic quantum numbers caused by the resonance light pair LL1 may not be sufficiently cancelled out or alleviated by the adjustment light LL2. Therefore, by FM-modulating the adjustment light LL2 and forming plural wavelength spectra of the adjustment light LL2, the driving current of the second light source 321 can be adjusted, and one of the plural wavelength spectra of the adjustment light LL2 can be adjusted in a desired wavelength width of an absorption wavelength range of the metal and in an allowable intensity range as shown in FIG. 6. Accordingly, by FM-modulating the adjustment light LL2, the number of metal atoms having desired magnetic quantum numbers in the atom cell 2 can be increased, and the intensity of an EIT signal can be improved.

In addition, the frequency at which the adjustment light LL2 is FM-modulated is lower than the frequency which is the wavelength width of an absorption wavelength range of the metal. As a result, at least one of plural wavelength spectra of the FM-modulated adjustment light LL2 can be easily adjusted in a wavelength width of an absorption wavelength range of the metal which is desired to cause the metal to resonate and in an allowable intensity range. Therefore, the number of metal atoms having desired magnetic quantum numbers contributing to EIT can be increased, and thus the intensity of an EIT signal can be effectively improved.

The wavelength of the resonance light pair LL1 emitted from the first surface emitting laser 41, which oscillates at a wavelength of 895 nm, is separated from the wavelength of the adjustment light LL2 emitted from the second surface emitting laser 42 which oscillates at a wavelength of 852 nm. Therefore, the generation of an unnecessary signal caused by the adjustment light LL2 which has an effect on the resonance light pair LL1 can be reduced.

The λ/4 wave plate 313 is disposed between the first and second light sources 311 and 321 and the atom cell 2. As a result, two kinds of light emitted from the first light source 311 and the second light source 321 can be allowed to pass through the λ/4 wave plate 313, and the device configuration can be simplified.

Second Embodiment

Next, a second embodiment of the invention will be described.

Figure 15:
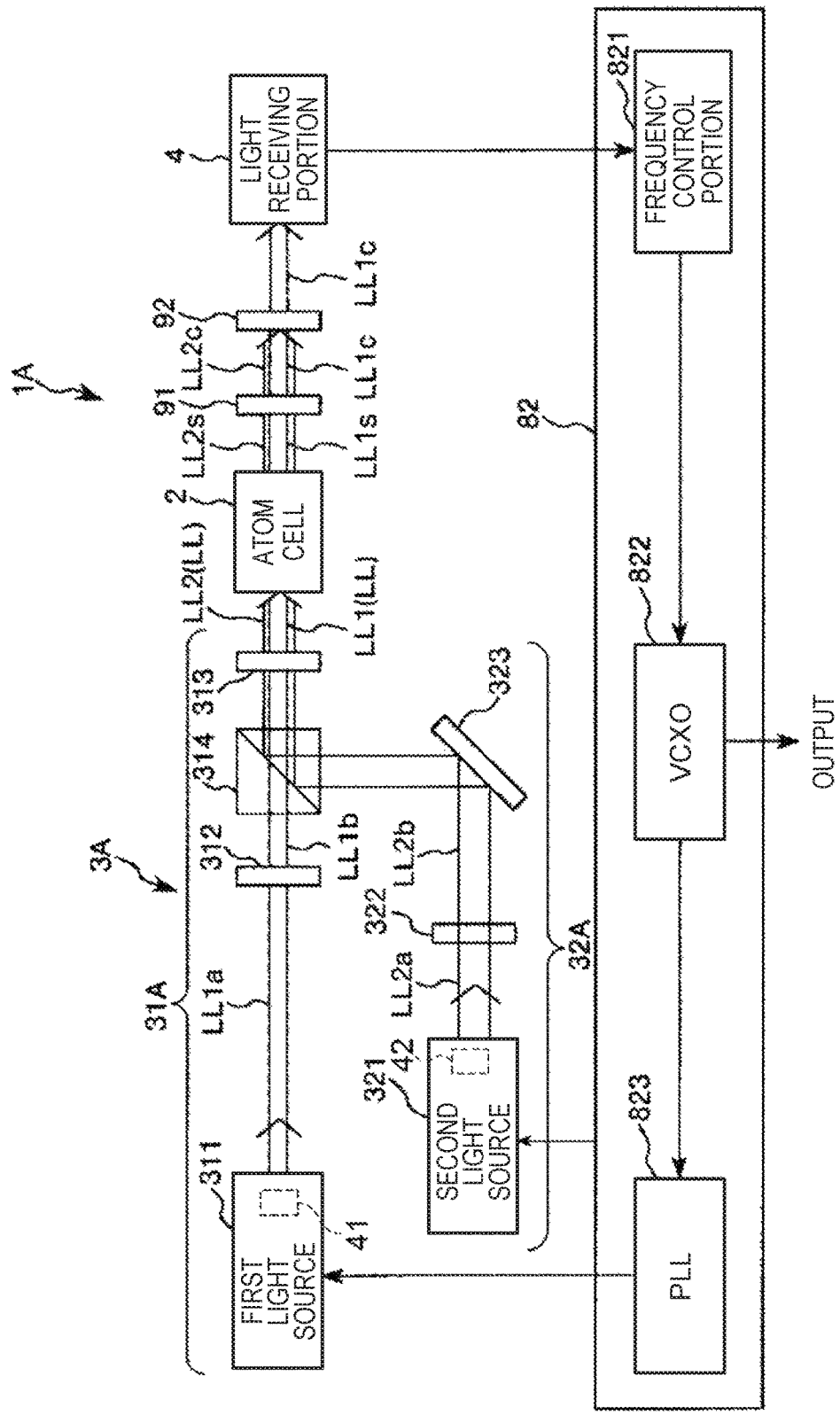
FIG. 15 is a schematic diagram showing an atomic oscillator (quantum interference device) according to a second embodiment of the invention.
Figure 16:
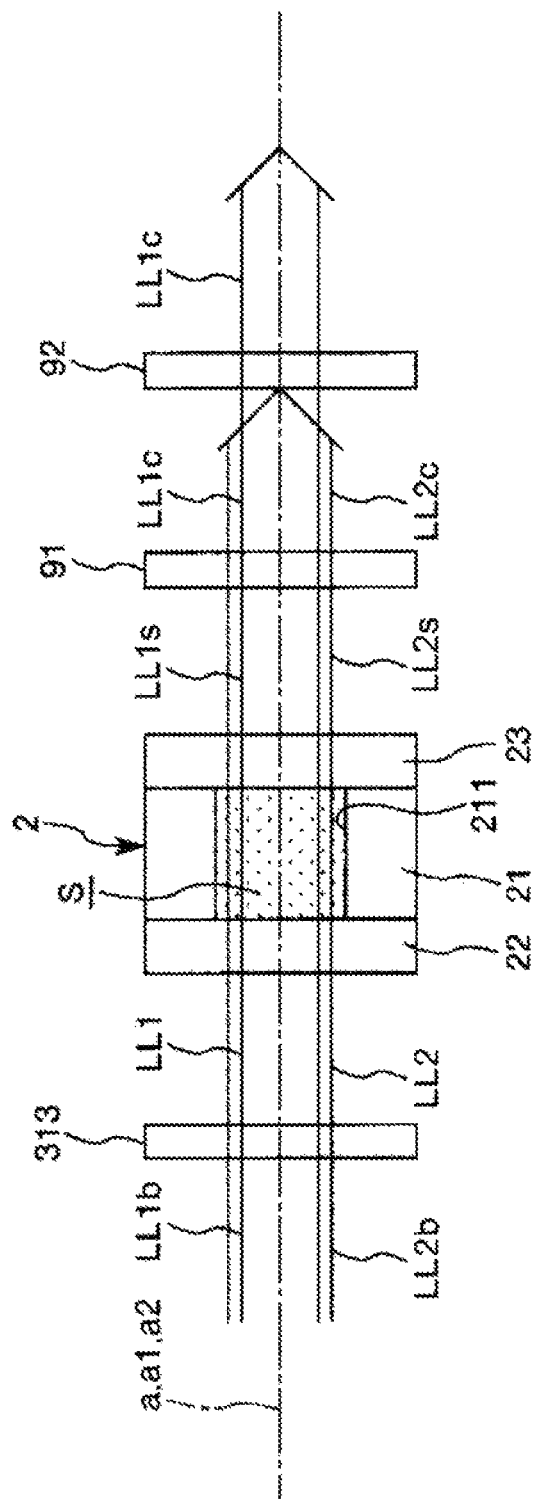
FIG. 16 is a diagram showing two kinds of light emitted from a first light source portion and a second light source portion of a light source portion shown in FIG. 15.

FIG. 15 is a schematic diagram showing an atomic oscillator (quantum interference device) according to the second embodiment of the invention. FIG. 16 is a diagram showing two kinds of light emitted from a first light source portion and a second light source portion of a light source portion shown in FIG. 15.

The second embodiment is the same as the first embodiment, except that: configurations of a first light source portion 31A and a second light source portion 32A are different from those in the first embodiment; and a λ/4 wave plate 91 and a polarizer 92 are additionally provided between the atom cell 2 and the light receiving portion 4.

In the following description, different points of the second embodiment from those of the first embodiment will be mainly described, and the same features of the second embodiment as those in the first embodiment will not be repeated. In addition, in FIGS. 15 and 16, the same components as those in the first embodiment are represented by the same reference numerals as those in the first embodiment.

An atomic oscillator 1A shown in FIG. 15 includes a light source portion 3A, the λ/4 wave plate 91, and the polarizer 92.

The light source portion 3A includes: the first light source portion 31A that emits the resonance light pair LL1; and the second light source portion 32A that emits the adjustment light LL2.

The first light source portion 31A has the same configuration as that of the first light source portion 31 in the first embodiment, except that a polarization beam splitter 314 is additionally provided between the λ/2 wave plate 312 and the λ/4 wave plate 313. That is, the first light source portion 31A includes the first light source 311, the λ/2 wave plate 312, the λ/4 wave plate 313, and the polarization beam splitter 314.

The second light source portion 32A has the same configuration as that of the second light source portion 32 in the first embodiment, except that a mirror 323 and the polarization beam splitter 314 are additionally provided between the neutral density filter 322 and the λ/4 wave plate 313. That is, the second light source portion 32A includes the second light source 321, the neutral density filter 322, the mirror 323, and the polarization beam splitter 314.

In the first light source portion 31A and the second light source portion 32A, the polarization beam splitter 314 are shared by the first light source portion 31A and the second light source portion 32A. In the first light source portion 31A, the resonance light pair LL1b passes through the polarization beam splitter 314 without any change and is incident on the λ/4 wave plate 313. On the other hand, in the second light source portion 32A, the resonance light LL2b, which has been reflected by the mirror 323, is reflected by the polarization beam splitter 314 and is incident on the λ/4 wave plate 313. That is, the resonance light pair LL1b and the resonance light LL2b are synthesized by the polarization beam splitter 314 such that the optical axes thereof match with each other, and then are incident on the λ/4 wave plate 313.

Here, the mirror 323 and the polarization beam splitter 314 constitute "a synthesis portion" where the resonance light pair LL1b and the resonance light LL2b are synthesized. Using the synthesis portion having the above-described configuration, the atom cell 2 can be irradiated with the resonance light pair LL1b and the resonance light LL2b such that the optical axes thereof match with each other. The mirror 323 is not necessarily provided. In this case, the second light source 321 and the neutral density filter 322 only has to be provided in a direction in which the resonance light LL2b is incident on the polarization beam splitter 314.

A λ/2 wave plate may be provided instead of the neutral density filter 322. By using the λ/2 wave plate, the intensity of the second light LL2a can be increased or decreased according to an angle at which the second light LL2a emitted from the second light source 321 is linearly polarized.

As shown in FIG. 16, in the atom cell 2 according to the second embodiment, the optical axis a1 of the resonance light pair LL1 is parallel to the optical axis a2 of the adjustment light LL2 and is parallel to the axis a of the atom cell 2. In FIG. 16, the optical axes a1 and a2 match with the axis a. By adjusting the optical axis a1 of the resonance light pair LL1 and the optical axis a2 of the adjustment light LL2 to be parallel to each other, the atom cell 2 can be efficiently irradiated with the resonance light pair LL1 and the adjustment light LL2.

The resonance light pair LL1s and the adjustment light LL2s having passed through the atom cell 2 are incident on the λ/4 wave plate 91. The λ/4 wave plate 91 is a birefringent element that generates a phase difference π/2) (90° between polarized components perpendicular to each other. The λ/4 wave plate 91 converts the circularly polarized resonance light pair LL1 into linearly polarized resonance light pair LL1c. In addition, the λ/4 wave plate 91 converts the circularly polarized adjustment light LL2 into adjustment light LL2c which is linearly polarized in a direction different from (a direction perpendicular to) the resonance light pair LL1c.

The resonance light pair LL1c and the adjustment light LL2c generated in the λ/4 wave plate 91 are incident on the polarizer 92 as a wavelength filter. The polarizer 92 allows transmission of light which is polarized in a specific direction, and allows transmission of the resonance light pair LL1c and blocks the adjustment light LL2c. As a result, only the resonance light pair LL1c is incident on the light receiving portion 4.

Here, the λ/4 wave plate 91 and the polarizer 92 constitute "a separation portion" which is disposed between the atom cell 2 and the light receiving portion 4 and separates the resonance light pair LL1s and the adjustment light LL2s from each other. By providing the separation portion, the reception of the adjustment light LL2 by the light receiving portion 4 can be prevented or reduced. In the second embodiment, the resonance light pair LL1s and the adjustment light LL2s are separated from each other by the λ/4 wave plate 91 and the polarizer 92. However, a wavelength filter that allows transmission of the resonance light pair LL1 and reflects the adjustment light LL2s may be disposed between the atom cell 2 and the light receiving portion 4.

Even in the above-described second embodiment, the intensity of an EIT signal can be effectively improved.

In addition, the polarizer 92 as the wavelength filter through which only the resonance light pair LL1s passes is disposed between the atom cell 2 and the light receiving portion 4. As a result, the adjustment light LL2s does not pass through the polarizer 92, the light receiving portion 4 receives only the resonance light pair LL1s, and the reception of the adjustment light LL2s by the light receiving portion 4 can be prevented or reduced.

2. Electronic Apparatus

The above-described atomic oscillator can be incorporated into various electronic apparatuses.

Next, an electronic apparatus according to the invention will be described.

Figure 17:
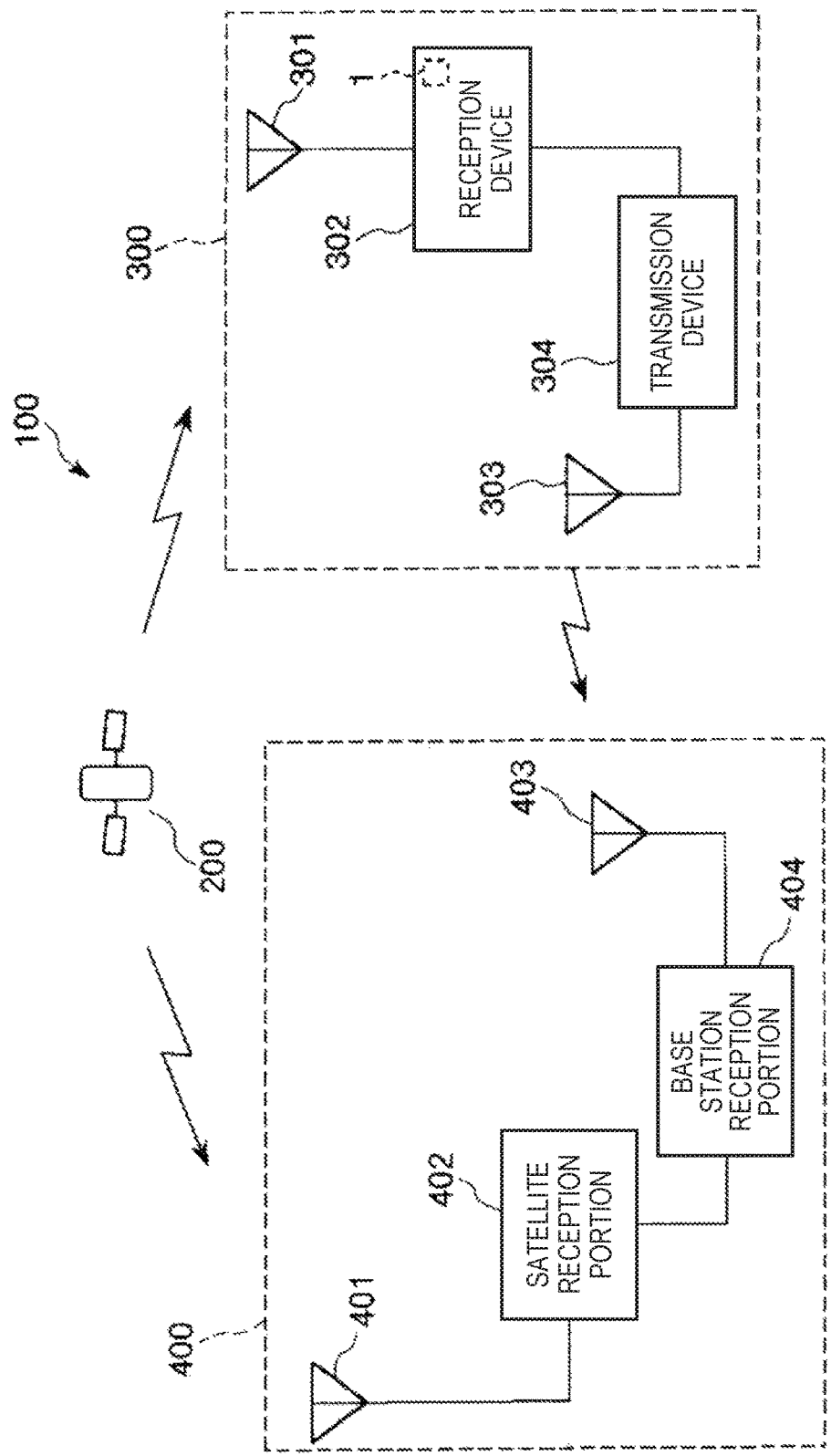
FIG. 17 is a diagram showing a schematic configuration in a case where the atomic oscillator according to the invention is used in a positioning system using a GPS satellite.

FIG. 17 is a diagram showing a schematic configuration in a case where the atomic oscillator according to the invention is used in a positioning system using a GPS satellite.

The positioning system 100 shown in FIG. 17 includes a GPS satellite 200, a base station device 300, and a GPS reception device 400.

The GPS satellite 200 transmits positioning information (GPS signal).

For example, the base station device 300 includes: a reception device 302 that accurately receives positioning information from the GPS satellite 200 through an antenna 301 provided at, for example, an electronic reference point (GPS continuous observation station); and a transmission device 304 that transmits the positioning information, which is received by the reception device 302, through an antenna 303.

Here, the reception device 302 is an electronic apparatus which includes the atomic oscillator 1 according to the invention as a reference frequency generating source. The reception device 302 has high reliability. In addition, the positioning information received by the reception device 302 is transmitted by the transmission device 304 in real time.

The GPS reception device 400 includes: a satellite reception portion 402 that receives positioning information from the GPS satellite 200 through an antenna 401; and a base station reception portion 404 that receives the positioning information from the base station device 300 through an antenna 403.

The electronic apparatus according to the invention is not limited thereto and is applicable to, for example, a mobile phone, a digital still camera, an ink jet ejecting device (such as an ink jet printer), a personal computer (a mobile personal computer or a lap top personal computer), a television, a video camera, a video tape recorder, a car navigation device, a pager, a personal digital assistant (including one having a communication function), an electronic dictionary, an electronic calculator, an electronic game device, a word processor, a work station, a video phone, a security monitor, electronic binoculars, a POS terminal, a medical apparatus (for example, an electronic thermometer, a blood pressure meter, a blood glucose meter, an electrocardiograph, an ultrasonograph, or an electronic endoscope), a fish finder, various measuring devices, meters (for example, meters of a vehicle, an airplane, or a ship), a flight simulator, a digital terrestrial television broadcasting system, a mobile phone base station, or a GPS module.

3. Moving Object

Figure 18:
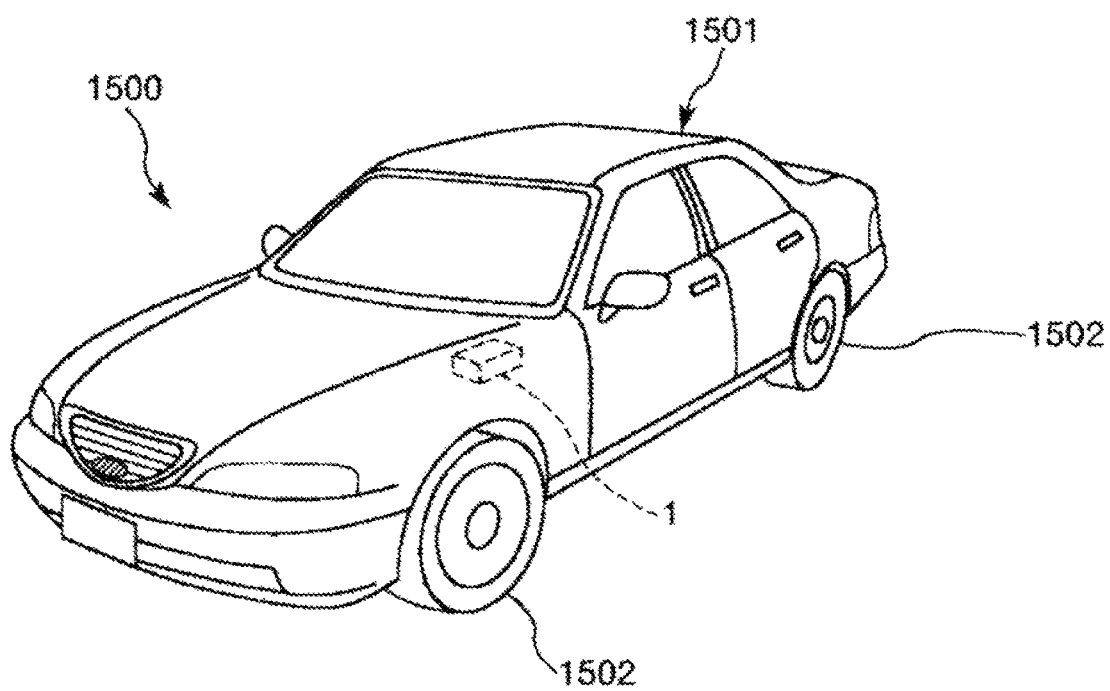
FIG. 18 is a diagram showing a moving object according to the invention.

FIG. 18 is a diagram showing an example of a moving object according to the invention.

In this drawing, a vehicle 1500 as the moving object includes a vehicle body 1501 and four wheels 1502, and the four wheels 1502 are configured to be rotated by a driving source (engine; not shown) provided in the vehicle body 1501. In the vehicle 1500, the atomic oscillator 1 is mounted.

Hereinabove, the quantum interference device, the atomic oscillator, the electronic apparatus, and the moving object according to the invention have been described based on the embodiments shown in the drawings, but the invention is not limited thereto.

In addition, the configuration of each portion according to the invention can be replaced with an arbitrary configuration that exhibits the same function as that in the above-described embodiments, and an arbitrary configuration may be added thereto. In addition, in the invention, arbitrary configurations of the above-described embodiments may be combined with each other.

The entire disclosure of Japanese Patent Application No. 2016-017717, filed Feb. 2, 2016 is expressly incorporated by reference herein.

What is claimed is:

1. A quantum interference device comprising:
an atom cell that encapsulates a metal;
a first light source portion that emits first light including a resonance light pair, the resonance light pair being circularly polarized in the same direction and causing the metal to resonate;
a second light source portion that emits second light including adjustment light, the adjustment light being circularly polarized in a direction opposite to the resonance light pair and causing the metal to resonate; and
a light receiving portion that receives the resonance light pair having passed through the atom cell,
wherein the adjustment light is FM-modulated.

2. The quantum interference device according to claim 1, wherein a frequency of the FM modulation is lower than a frequency which is a wavelength width of an absorption wavelength range of the metal.

3. The quantum interference device according to claim 1, wherein a wavelength of the adjustment light is separated from a wavelength of the resonance light pair.

4. The quantum interference device according to claim 1, wherein the first light source portion has a first surface emitting laser that oscillates at a wavelength of 895 nm, and
the second light source portion has a second surface emitting laser that oscillates at a wavelength of 852 nm.

5. The quantum interference device according to claim 1, wherein the first light source portion has a first light source that emits linearly polarized light,
the second light source portion has a second light source that emits linearly polarized light, and
the quantum interference device further comprises a λ/4 wave plate that is provided between the first light source portion and the second light source portion and through which two kinds of light emitted from the first light source and the second light source pass.

6. The quantum interference device according to claim 1, further comprising
a wavelength filter that is disposed between the atom cell and the light receiving portion and through which the resonance light pair passes.

7. An atomic oscillator comprising
the quantum interference device according to claim 1.

8. An atomic oscillator comprising
the quantum interference device according to claim 2.

9. An atomic oscillator comprising
the quantum interference device according to claim 3.

10. An atomic oscillator comprising
the quantum interference device according to claim 4.

11. An atomic oscillator comprising
the quantum interference device according to claim 5.

12. An electronic apparatus comprising
the quantum interference device according to claim 1.

13. An electronic apparatus comprising
the quantum interference device according to claim 2.

14. An electronic apparatus comprising
the quantum interference device according to claim 3.

15. An electronic apparatus comprising
the quantum interference device according to claim 4.

16. An electronic apparatus comprising
the quantum interference device according to claim 5.

17. A moving object comprising
the quantum interference device according to claim 1.

18. A moving object comprising
the quantum interference device according to claim 2.

19. A moving object comprising
the quantum interference device according to claim 3.

20. A moving object comprising
the quantum interference device according to claim 4.

* * * * *